US008374206B2

(12) United States Patent  
Peng et al.

(10) Patent No.: US 8,374,206 B2
(45) Date of Patent: Feb. 12, 2013

(54) COMBINING MULTIPLE LASER BEAMS TO FORM HIGH REPETITION RATE, HIGH AVERAGE POWER POLARIZED LASER BEAM

(75) Inventors: Xiaoyuan Peng, Portland, OR (US); William J. Jordens, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 285 days.

(21) Appl. No.: 12/934,928

(22) PCT Filed: Mar. 27, 2009

(86) PCT No.: PCT/US2009/038559
§ 371 (c)(1),
(2), (4) Date: Dec. 2, 2010

(87) PCT Pub. No.: WO2009/137182
PCT Pub. Date: Nov. 12, 2009

(65) Prior Publication Data
US 2011/0267671 A1    Nov. 3, 2011

Related U.S. Application Data

(60) Provisional application No. 61/041,132, filed on Mar. 31, 2008, provisional application No. 61/041,143, filed on Mar. 31, 2008.

(51) Int. Cl.
*H01S 3/10* (2006.01)
(52) U.S. Cl. .................. 372/27; 372/26; 372/25
(58) Field of Classification Search ............ 372/27, 372/26, 25
See application file for complete search history.

(56) References Cited

U.S. PATENT DOCUMENTS

| 3,747,019 | A | 7/1973 | Koechner et al. |
| 4,256,962 | A | 3/1981 | Horton et al. |
| 4,483,005 | A | 11/1984 | Smart |
| 4,937,457 | A | 6/1990 | Mitchell |
| 5,265,114 | A | 11/1993 | Sun et al. |
| 5,307,369 | A | 4/1994 | Kimberlin |

(Continued)

FOREIGN PATENT DOCUMENTS

| JP | 1032887 | 12/1998 |
| JP | 11245073 | 9/1999 |

(Continued)

OTHER PUBLICATIONS

Nov. 11, 2011 Search and Examination Report concerning corresponding Singapore Patent Application No. 201006414-5.

(Continued)

*Primary Examiner* — Kinam Park
(74) *Attorney, Agent, or Firm* — Stoel Rives LLP

(57) ABSTRACT

Two pulsed lasers (14) or sets of lasers propagate beams of pulses (20) having orthogonally related polarization states. A beam combiner (24) combines the orthogonal beams to form a combined beam propagating along a common beam path (16) to intersect an optical modulator (30) that selectively changes the polarization state of selected pulses of either beam to provide a composite beam (18) including similarly polarized pulses from the orthogonal beams. The composite polarized beam has a composite average power and a composite repetition rate that are greater than those provided by either laser. The optical modulator can also selectively control the polarization states of pulses from either laser to pass through or be blocked by a downstream polarizer (32). Additional modulators may facilitate pulse shaping of the pulses. The system is scalable by addition of sets of single lasers or pairs of lasers with beam combiners and modulators.

20 Claims, 18 Drawing Sheets

U.S. PATENT DOCUMENTS

| | | | |
|---|---|---|---|
| 5,473,624 A | 12/1995 | Sun | |
| 5,593,606 A | 1/1997 | Owen et al. | |
| 5,719,372 A | 2/1998 | Togari et al. | |
| 5,742,626 A | 4/1998 | Mead et al. | |
| 5,756,924 A | 5/1998 | Early | |
| 6,025,256 A | 2/2000 | Swenson et al. | |
| 6,057,180 A | 5/2000 | Sun et al. | |
| 6,266,359 B1 | 7/2001 | Taheri et al. | |
| 6,339,604 B1 | 1/2002 | Smart | |
| 6,340,806 B1 | 1/2002 | Smart et al. | |
| 6,541,731 B2 | 4/2003 | Mead et al. | |
| 6,760,151 B1 * | 7/2004 | Vail et al. | 359/341.3 |
| 6,878,899 B2 | 4/2005 | Smart | |
| 6,947,454 B2 | 9/2005 | Sun et al. | |
| 6,961,355 B1 | 11/2005 | Yin et al. | |
| 6,972,268 B2 | 12/2005 | Ehrmann et al. | |
| 7,126,746 B2 | 10/2006 | Sun et al. | |
| 7,199,924 B1 | 4/2007 | Brown et al. | |
| 7,396,706 B2 | 7/2008 | Sun et al. | |
| 7,502,111 B2 | 3/2009 | Gibbs | |
| 2002/0000426 A1 * | 1/2002 | Mead et al. | 219/121.7 |
| 2002/0167581 A1 * | 11/2002 | Cordingley et al. | 347/173 |
| 2003/0151053 A1 | 8/2003 | Sun et al. | |
| 2004/0134894 A1 | 7/2004 | Gu et al. | |
| 2004/0188399 A1 | 9/2004 | Smart | |
| 2005/0041976 A1 | 2/2005 | Sun et al. | |
| 2005/0067388 A1 | 3/2005 | Sun et al. | |
| 2005/0100062 A1 | 5/2005 | Grant et al. | |
| 2005/0281306 A1 | 12/2005 | Nakao et al. | |
| 2006/0028655 A1 | 2/2006 | Cordingley et al. | |
| 2006/0126677 A1 | 6/2006 | Sun et al. | |
| 2006/0141681 A1 | 6/2006 | Sun et al. | |
| 2006/0159138 A1 | 7/2006 | Deladurantaye et al. | |
| 2006/0159149 A1 | 7/2006 | Chaput | |
| 2006/0198402 A1 | 9/2006 | Hodgson et al. | |
| 2006/0209916 A1 | 9/2006 | Holtaway et al. | |
| 2007/0140634 A1 | 6/2007 | Windeler et al. | |
| 2007/0153841 A1 | 7/2007 | Sun et al. | |
| 2008/0063015 A1 | 3/2008 | Trifonov et al. | |
| 2009/0245301 A1 * | 10/2009 | Peng et al. | 372/25 |
| 2009/0245317 A1 | 10/2009 | Peng et al. | |

FOREIGN PATENT DOCUMENTS

| | | |
|---|---|---|
| JP | 2000-216465 | 8/2000 |
| JP | 2002-246677 | 8/2002 |
| JP | 2003-094191 | 4/2003 |
| WO | WO 01/14096 | 3/2001 |
| WO | WO 2008/014331 | 1/2008 |

OTHER PUBLICATIONS

Jan. 5, 2012 Office action for corresponding Chinese Patent Application No. 2009801101492.

Aug. 14, 2012 Office action for corresponding Chinese Patent Application No. 2009801101492.

Peng, Xiaoyuan; Xu, Lei; and Asundi, Anand, "Power Scaling of Diode-Pumped Nd:YVO$_4$ Lasers," IEEE Journal of Quantum Electronics, vol. 38, No. 9, Sep. 2002, pp. 1291-1299.

International Search Report and Written Opinion for International Patent Application No. PCT/US09/038559, Nov. 30, 2009.

International Preliminary Report on Patentability for International Patent Application No. PCT/US09/038559, Oct. 14, 2010.

* cited by examiner

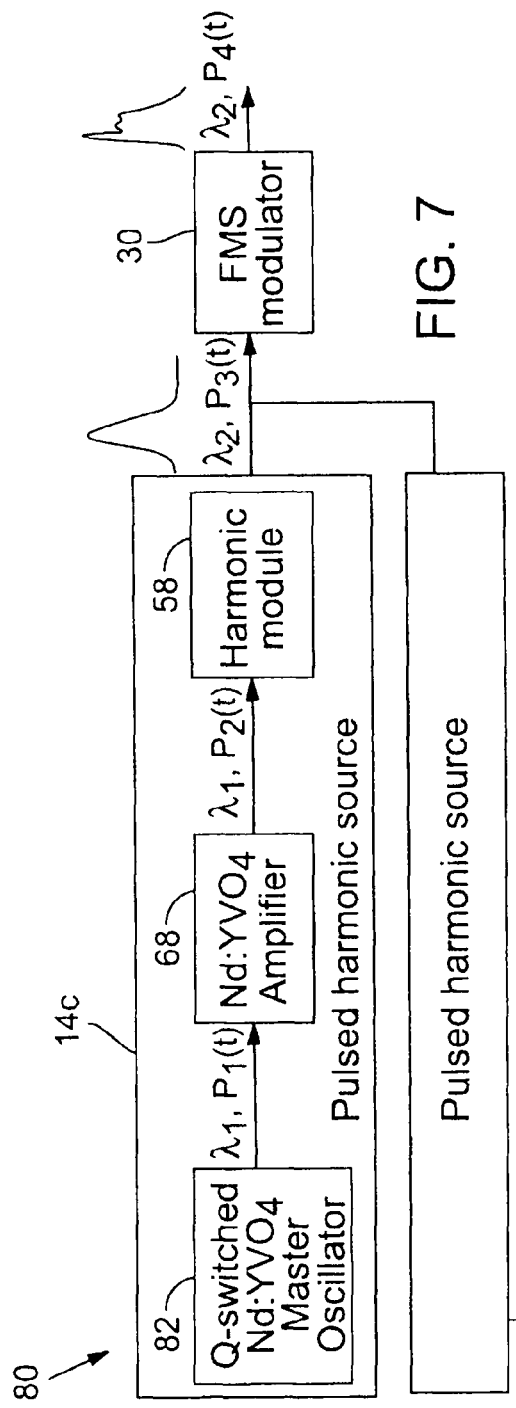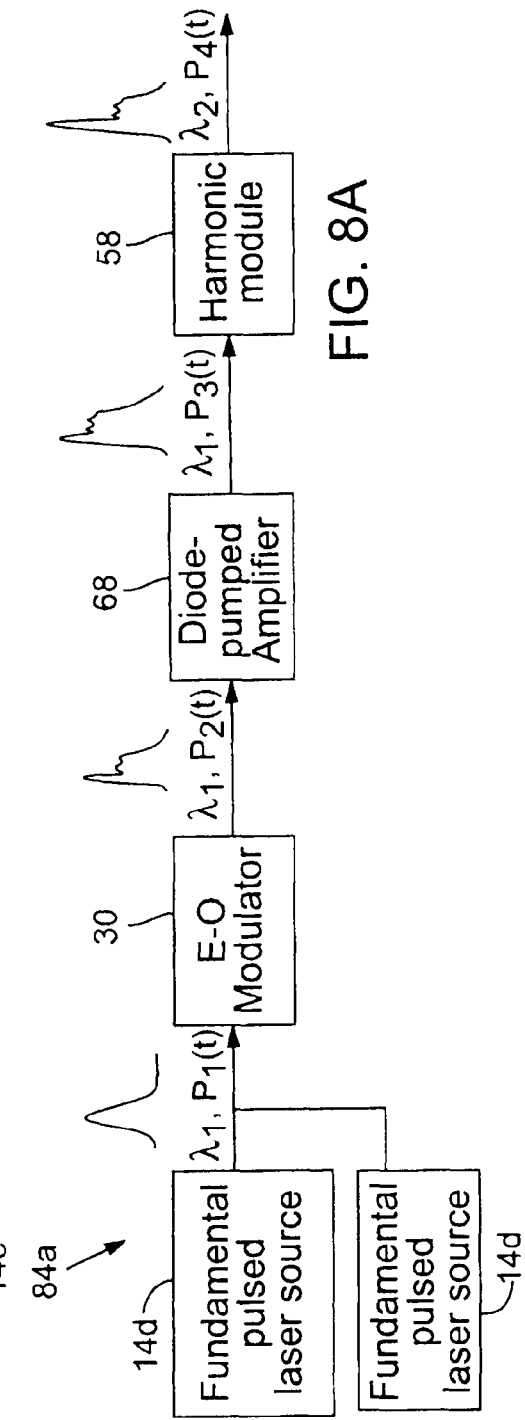

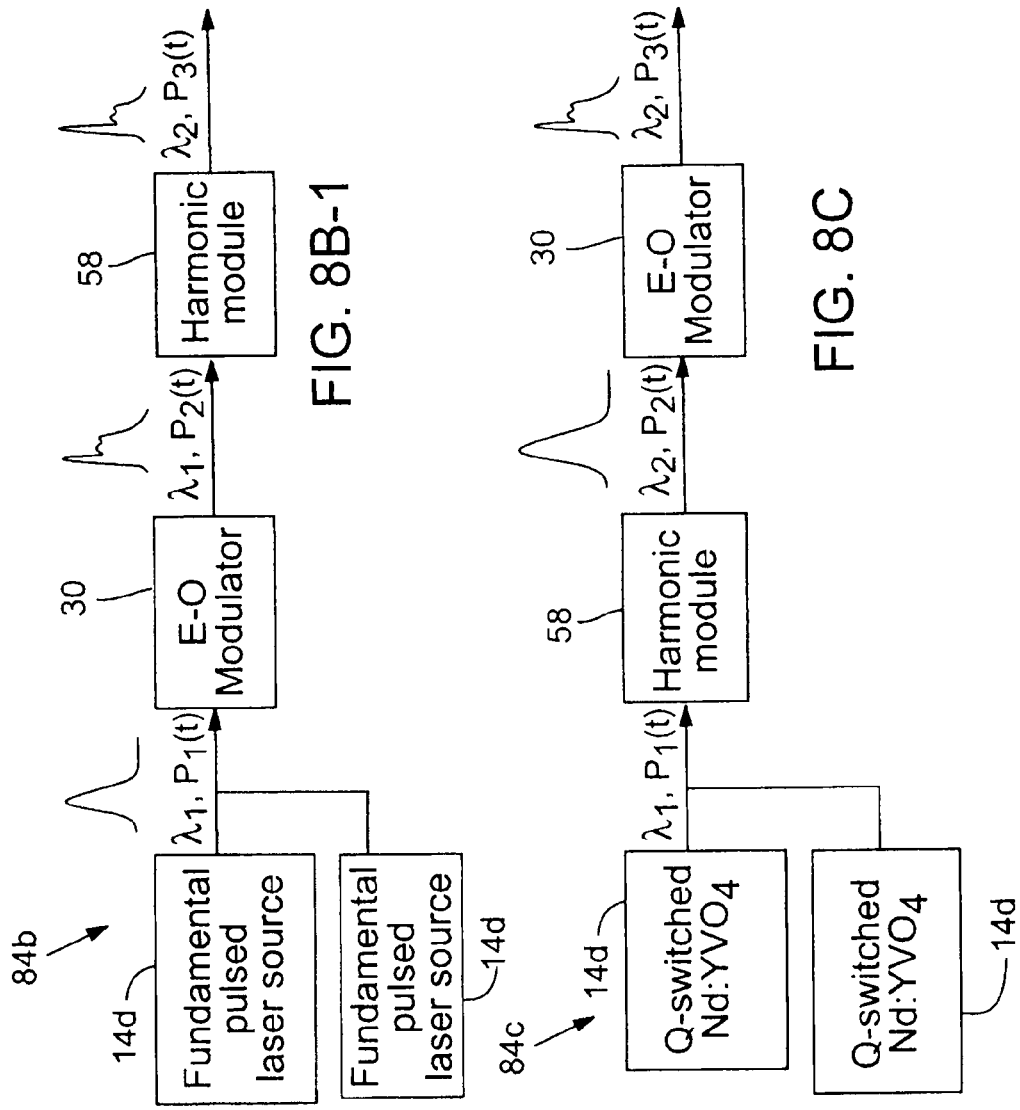

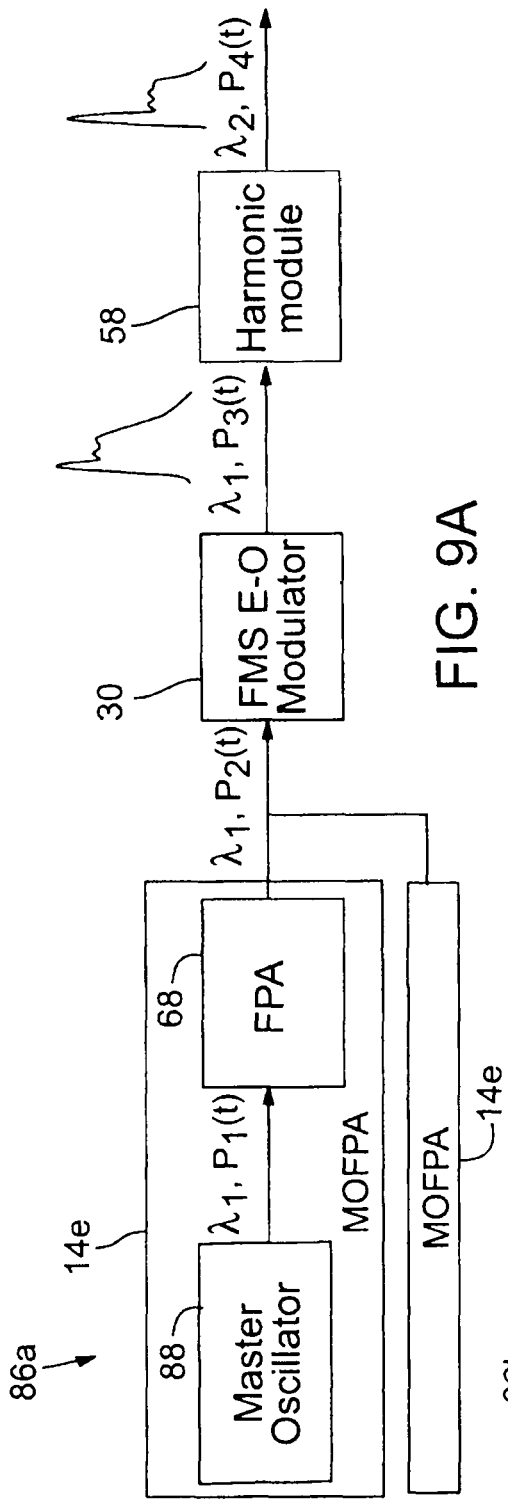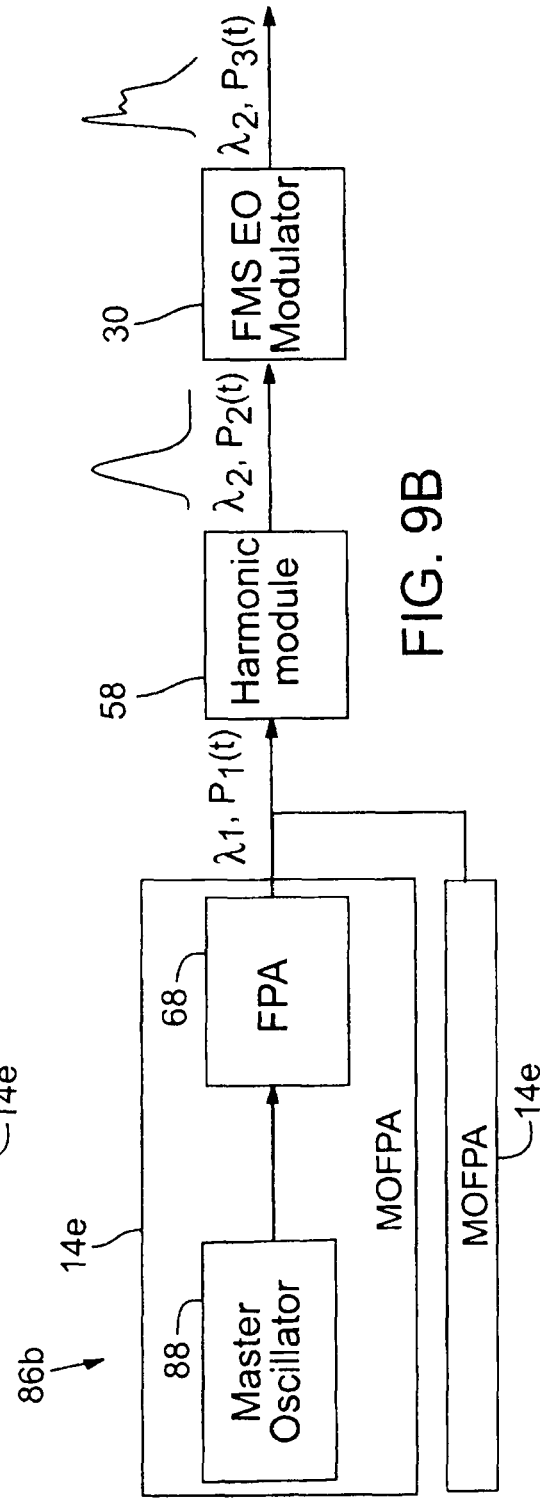
FIG. 9A
FIG. 9B

COMBINING MULTIPLE LASER BEAMS TO FORM HIGH REPETITION RATE, HIGH AVERAGE POWER POLARIZED LASER BEAM

RELATED APPLICATIONS

This application claims benefit of International Application No. PCT/US2009/038559, filed Mar. 27, 2009, which claims benefit of U.S. Provisional Patent Application Nos. 61/041,132 and 61/041,143, both of which filed Mar. 31, 2008.

COPYRIGHT NOTICE

©2010 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

The disclosure concerns combining laser beams and, in particular, to optical modulator applications associated with combining laser beams to increase repetition rate.

BACKGROUND INFORMATION

Laser beam combining has been used for increasing power, for double pulse processing, and for creating beams having more than one wavelength.

U.S. Pat. No. 5,742,626 describes splitting a beam, passing one portion of it through a harmonic converter and remixing the beam portions in a sum frequency generator to obtain a deep UV beam.

U.S. Pat. No. 5,756,924 employs a beam combiner for providing coaxial propagation of combined laser outputs and subsequent spatial overlap in the focal volume of a focusing lens.

U.S. Pat. No. 6,266,359 proposes a splicing asymmetric reflective array for combining two beams.

U.S. Pat. Appl. Pub. No. 2003-0151053 proposes a method of combining laser pulses from two lasers using synchronizing electronics and a triggering delay.

U.S. Pat. No. 6,541,731 proposes beam combining to provide multiple working beams, or a combined beam, of different polarizations. In one embodiment, an electro-optic modulator appears to be employed as a pulse picker.

U.S. Pat. Appl. Pub. No. 2004-0134894 also appears to propose a method of combining laser pulses (or generating a sequence of closely spaced pulses) from two lasers using delayed triggering. The described configuration of seed pulses working with an optical amplifier is of a standard design because the combiner has low efficiency.

U.S. Pat. No. 7,396,706 describes combining synchronized pulses from two Q-switched lasers to provide laser output having the same or different energy and/or wavelength features from both pulses.

U.S. Pat. Appl. Pub. No. 2006-0198402 combines pulses from four extra-cavity, frequency-tripled lasers to provide a combined pulse of predetermined energy.

U.S. Pat. No. 7,199,924 proposes combining two beams using a wavelength-dispersion compensation combiner having a plurality of asymmetric gratings.

These patents and publications offer some advantages for implementing their specific applications but suffer from disadvantages when applied to other applications.

SUMMARY OF THE DISCLOSURE

In some exemplary embodiments, two lasers emit pulsed laser beams conditioned to have orthogonally related polarization states. The pulses of the two laser beams are time-displaced and delivered to a beam combiner, which combines them to form a combined laser beam that includes a series of laser pulses with alternating orthogonally related polarization states. The combined laser beam propagates from the beam combiner along a common beam path that intersects an optical modulator such as an EOM (electro-optic modulator). The EOM in response to a modulator drive signal selectively changes the polarization state of selected pulses of one of the two laser beams to provide a composite laser beam, in which the polarization states of the laser pulses of the two beams are the same.

In some additional, alternative, or cumulative exemplary embodiments, the EOM alternates the laser pulses of the two pulsed laser beams to provide a composite repetition rate of laser pulses from both lasers that is greater than the individual repetition rate of either of them. The operation of the EOM contributes to scaling the pulse repetition rate of the polarized laser beams without substantial power loss.

In some additional, alternative, or cumulative exemplary embodiments, the composite polarized beam has a composite average power that is greater than the individual average power of the beams from either laser.

In some additional, alternative, or cumulative exemplary embodiments, a polarizer is provided downstream of the EOM to facilitate its operation as a pulse picker. The EOM is selectively controlled to provide polarization states to pulses from either laser to determine whether selected pulses pass through or are blocked by the polarizer.

In some additional, alternative, or cumulative exemplary embodiments, the lasers are seed lasers and the combined beam path may include an optical isolator and a power amplifier.

In some additional, alternative, or cumulative exemplary embodiments, the lasers are fiber lasers and the EOMs are fiber-based interferometers.

In some additional, alternative, or cumulative exemplary embodiments, the polarization state-changing EOM can also be employed to facilitate pulse shaping of the laser pulses, or one more additional EOMs can be employed to facilitate pulse shaping of the laser pulses with or without the integration of the initial polarization rotating EOM.

In some additional, alternative, or cumulative exemplary embodiments, the system is scalable by addition of sets of single lasers or pairs of lasers with beam combiners and EOMs.

Additional aspects and advantages will be apparent from the following detailed description of preferred embodiments, which proceeds with reference to the accompanying drawings.

BRIEF DESCRIPTION OF THE DRAWINGS

FIG. 7 shows a laser system implemented with preferred pulsed harmonic laser sources.

FIG. 8A is a simplified block diagram of a laser system employing a fast multi-state (FMS) electro-optical modulator and fundamental pulsed laser sources in cooperation with a diode-pumped amplifier and a harmonic conversion module to produce a tailored pulse output.

FIG. 8B-1 is a simplified block diagram of a laser system of a type similar to the laser system of FIG. 8A, except for direct coupling of the output of the FMS electro-optical modulator without amplification into the harmonic conversion module to produce a tailored pulse output.

FIGS. 8B-2 and 8B-3 depict different pairs of three oscilloscope traces that show the laser output pulse waveforms of the pulsed laser source, FMS electro-optical modulator, and harmonic conversion module of the laser system of FIG. 8B-1.

FIG. 8C is a simplified block diagram of a laser system employing a Q-switched laser and a harmonic conversion module that cooperate to form and apply to an FMS electro-optical modulator a frequency-converted laser output for direct production of a tailored pulse output.

FIG. 9A is a simplified block diagram of a laser system employing a master oscillator fiber power amplifier (MOFPA) and an FMS electro-optical modulator in cooperation with a harmonic conversion module to produce a tailored pulse output.

FIG. 9B is a simplified block diagram of a laser system of a type similar to the laser system of FIG. 9A, except for interchanged positions of the FMS electro-optical modulator and harmonic conversion module to produce direct shaping of a harmonic laser pulse generated by the MOFPA and harmonic conversion module.

DETAILED DESCRIPTION OF PREFERRED EMBODIMENTS

Figure 1:
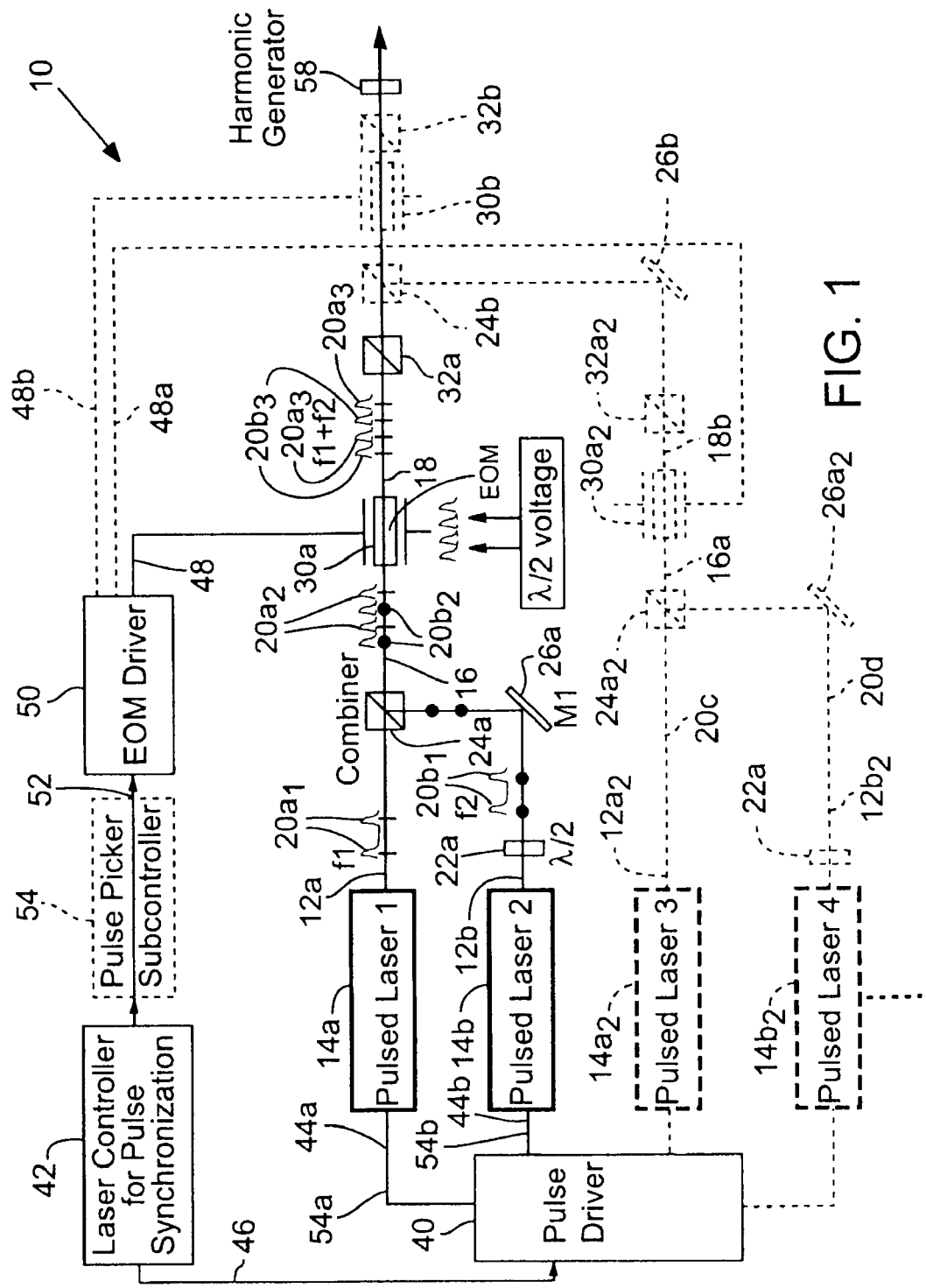
FIG. 1 is a block diagram of an exemplary laser system for combining pulsed polarized laser beams.

FIG. 1 shows an exemplary laser system 10 for combining laser beam paths 12a and 12b from respective pulsed lasers 14a and 14b to produce along a combined beam path 16 a composite output beam 18 that may have one or more properties that are beyond the individual capabilities of either pulsed laser 14a or 14b. Almost any type of pulsed laser 14 is suitable for use with the beam combining techniques described herein. Exemplary pulsed lasers 14 include, but are not limited to, diode-pumped solid-state lasers, fiber lasers, diode lasers, semiconductor lasers, gas lasers, or copper vapor lasers.

Some of such pulsed lasers 14 may emit a laser pulse 20 having a pulse width as short as a few femtoseconds while others may emit a laser pulse 20 having a pulse width as long as several 100 nanoseconds or longer, or any of various ranges of pulse widths in between. In some embodiments, the pulse widths may be from about 10 femtoseconds to about 1 picosecond, from about 1 picosecond to about 1 nanosecond, from about 1 nanosecond to about 100 nanoseconds, or from about 1 nanosecond to 600 nanoseconds.

Some of such pulsed lasers 14 may provide repetition rates as small as a few hertz, while others may be pulsed at frequencies of up to 40 GHz, or any of various ranges of repetition rates in between. In some embodiments, the frequencies may be from about 1 Hz to about 100 Hz, from about 10 Hz to about 1 KHz, from about 1 KHz to 1 MHz, or from about 1 MHz to about 40 GHz. Much larger overlapping ranges are also possible.

The beam combining techniques are particularly advantageous for pulsed lasers 14 having one or both of repetition rate limitations and average power limitations. The combined laser sources can reach combined repetition rates of greater than 40 GHz as well as smaller repetition rates. The ranges of composite repetition rates may be any multiple of the repetition rate ranges previously discussed.

Pulsed lasers 14 may emit a laser pulse 20 having a known fundamental laser wavelength; however, pulsed lasers 14 may include harmonic converters such as one or more nonlinear crystals to convert the fundamental wavelength to a known harmonic wavelength. An exemplary fundamental wavelength includes, but is not limited to, a 1 μm Nd-doped solid state laser, fiber laser, or semiconductor laser. Exemplary harmonic wavelengths include, but are not limited to, second harmonics, third harmonics, fourth harmonics, and fifth harmonics. Exemplary specific harmonic wavelengths include, but are not limited to, 532 nm, 355 nm, 266 nm, and 213 nm. Other frequency conversion technologies, such as optical parameter oscillation and Raman shift techniques, may also be employed, for example, to provide longer wavelengths such as middle infrared. In many exemplary embodiments, pulsed lasers 14a and 14b are substantially the same pulsed lasers 14. In some exemplary embodiments, pulsed lasers 14a and 14b are similar but emit at a different wavelength. In some embodiments, pulsed lasers 14a and 14b may be different types of pulsed lasers 14.

In some embodiments, initiation of laser pulses $20a_1$ (f1) from the pulsed laser 14a and laser pulses $20b_1$ (f2) from the pulsed laser 14b is controlled directly or indirectly by pulse initiation signals (typically in the form of voltage changes) produced from a common pulse driver 40 in response to command signals directly or indirectly from a laser controller 42. In other embodiments, initiation of laser pulses $20a_1$ and $20b_1$ is controlled directly or indirectly by pulse initiation signals from respective independent pulse drivers 40 in response to command signals 46 from a common laser controller 42. In exemplary preferred embodiments, the initiation of laser pulses $20a_1$ and $20b_1$ is controlled so that the laser pulses $20a_1$ and $20b_1$ do not temporally overlap, especially for applications in which commonly polarized composite output beam 18 is desired.

In some embodiments, pulsed lasers 14a and 14b are pulsed at the same repetition rate but with the pulse initiation times being offset by a time delay. In some embodiments, the time delay is greater than the sum of the pulse width of a laser pulse 20 and any jitter time associated with pulsed lasers 14; or in other embodiments, the time delay is greater than the sum of twice the pulse width of a laser pulse 20 plus any jitter time associated with pulsed lasers 14.

In some exemplary embodiments that address pulse jitter stemming from laser driving electronics (to avoid accidental overlap), pulse synchronization techniques disclosed in U.S. Pat. No. 7,396,706, which is herein incorporated by reference, may be employed. For example, if pulsed lasers 14a and 14b are Q-switched lasers, they can be driven by synchronized drive signals developed by a common pulse driver 40. The common pulse driver 40 provides laser pulse timing demand control signals to an RF signal driver (not shown), which in response provides synchronized RF signals to acousto-optic Q-switches in the pulsed lasers 14a and 14b through respective RF coaxial cables 44a and 44b (or other appropriate signal propagation medium). Different lengths of RF coaxial cables 44a and 44b between RF signal driver and the respective acousto-optic Q-switches can be used to provide a delay time between the corresponding laser pulses $20a_1$ and $20b_1$ propagating from the respective pulsed lasers 14a and 14b.

In some exemplary embodiments, the time delay provided by the different lengths of RF coaxial cables 44a and 44b is greater than the time jitter associated with quantum noise in the laser resonators. In some embodiments, the time delay provided by the different lengths of RF coaxial cables 44a and 44b is greater than twice the time jitter associated with quantum noise in the laser resonators. In some exemplary embodiments, especially those having applications where consecutively generated pulses are commonly used as working pulses, the time delay provided by the different lengths of respective RF cables 44 is greater than n times the time jitter associated with quantum noise in the laser resonators, where n equals the number of pulsed lasers 14 being combined.

Also with some such embodiments, when laser pulses $20a_1$ and $20b_1$ are requested by laser pulse timing demand control signals, both laser energies are fired when both RF drive signals applied to acousto-optic Q-switches are at a zero voltage level crossing, i.e., not random relative to the RF drive signal level, to maintain high laser output amplitude stability. However, even if the Q-switch RF signal cut-off exhibits a time jitter of the same x ns relative to laser pulse timing demand control signal, there is no relative pulse jitter as between the laser pulses because of the synchronization of both RF drive signals applied to acousto-optic Q-switches. Thus, a stable laser pulse energy profile is achievable with accurate timing between the laser pulse peaks. An operational tolerance of laser stability within about ±10% is achievable.

In another example, in which pulsed lasers 14a and 14b are Q-switched lasers, the RF signal driver employs an RF signal generator to provide a common Q-switch RF signal to respective RF driver/amplifiers that provide the RF drive signals along the coaxial cables 44a and 44b to the acousto-optic Q-switches.

In another example, where pulsed lasers 14a and 14b are Q-switched lasers, the RF signal driver employs a RF frequency generator that provides a common Q-switch RF frequency signal to respective RF signal generator and amplifier combinations that provide the RF drive signals along the coaxial cables 44a and 44b to the acousto-optic Q-switches. In this example, the Q-switch RF signal driver uses a common Q-switch RF frequency signal as an input to the different RF signal generators and their respective power amplifiers driving the different acousto-optic devices. The difference of Q-switch RF signal cut-off times for the different power amplifiers can be, for example, an integer number times one-half of the Q-switch RF frequency cycle time. In this case, all of the RF signals applied to different laser heads would be cut off at the zero voltage level crossing with, however, a delay time of, for example, an integer number times one-half of the Q-switch RF frequency cycle time. This would give a programmable delay time between the laser pulses in steps of a few nanoseconds to 50 ns or greater, for example, depending on the Q-switch RF signal frequency. Some of these embodiments might be useful for placing two or more pulses on an IC link during on-the-fly link processing.

Skilled persons will appreciate that when the RF trigger points of RF signal generators are continuously programmable at the same level or different levels, a continuously programmable delay time between the first and second laser energies can be realized.

Skilled persons will appreciate that in exemplary embodiments utilizing other pulse initiation techniques, pulse driving offset (and synchronization to the extent that it may be warranted) may be achieved by corresponding mechanisms or other well known synchronization techniques. In some embodiments in which, for example, the pulsed lasers 14a and 14b are diode seed lasers, the electrical signals applied to the respective diodes can be offset.

With reference again to FIG. 1, in some embodiments, laser pulses $20a_1$ emitted by pulsed laser 14a are linearly polarized in a polarization direction that is orthogonal to the polarization direction of linearly polarized laser pulses $20b_1$ emitted by pulsed laser 14b. In other embodiments, laser pulses $20a_1$ emitted by pulsed laser 14a are linearly polarized in a polarization direction that is parallel to the polarization direction of linearly polarized laser pulses $20b_1$ emitted by pulsed laser $14b$. If laser pulses $20a_1$ and $20b_1$ have parallel polarization directions, an otherwise optional half-wave plate 22 may be positioned along one of laser beam paths $12a$ or $12b$ between the respective laser $14a$ or $14b$ and a beam combiner $24a$.

For convenience, FIG. 1 shows exemplary polarization directions of laser pulses $20a_1$ as parallel lines and exemplary orthogonal polarization directions of laser pulses $20b_1$ as dots; however, skilled persons will appreciate that the polarization directions could be reversed and the orientation or axes of the beam combiner could be adjusted accordingly. One or more fold mirrors $26a$ may also be positioned along one or both of laser beam paths $12a$ and $12b$ as warranted to propagate laser pulses $20a_1$ and $20b_1$ to beam combiner $24a$.

Beam combiner $24a$ can be, for example, a polarizing cube or a thin-film polarizer, both of which are commonly available optical elements well known to skilled practitioners. These types of beam combiner $24a$ have the advantage of minimal loss of the power of laser pulses $20a_1$ and $20b_1$ as long as laser pulses $20a_1$ and $20b_1$ have orthogonal polarization directions. For example, beam combiner $24a$ may be transmissive to laser pulses $20a$ while reflective to laser pulses $20b$, or alternatively transmissive to laser pulses $20b$ while reflective to laser pulses $20a$, as long as pulses $20a$ and $20b$ are orthogonally polarized. Beam combiner $24a$ is of a preferred type in which there is low loss of power of the laser beams undergoing combination, in which low loss is less than half of the average power of the beams of laser pulses $20a$ and $20b$, preferably less than 10% loss, more preferably less than 5% loss, and most preferably less than 1% loss. Beam combiner $24a$ combines laser pulses $20a_1$ and $20b_1$ of orthogonally related polarization directions to form a combined beam of laser pulses $20a_2$ and $20b_2$ propagating along combined beam path 16.

Combined beam path 16 intersects an optical modulator $30a$. In some embodiments, optical modulator $30a$ is an EOM $30a$, such as a Pockels cell. In some embodiments, optical modulator $30a$ is a fiber-based interferometer $30a$ (such as later described). Fiber-based interferometers $30a$ may be preferred for embodiments that employ fiber devices such as fiber lasers or fiber amplifiers. For convenience, some embodiments are described with reference to EOM $30a$, optical modulator $30a$, or fiber-based interferometer $30a$. However, skilled persons will appreciate that specific types of optical modulators $30a$ may be preferred for specific applications.

In some exemplary embodiments, the EOM $30a$ may be selectively activated by command signals 48 directly or indirectly from an EOM driver 50 in response to command signals 52 directly or indirectly from laser controller 42. In some embodiments, EOM $30a$ may be selectively activated to impart half-wave optical retardation ($\lambda/2$ voltage) to selected laser pulses $20a_2$ to change their polarization direction to match the polarization direction of laser pulses $20b_2$ or may be selectively activated to impart half-wave optical retardation to selected laser pulses $20b_2$ to change their polarization direction to match the polarization direction of laser pulses $20a_2$ to propagate a composite polarized beam 18 of pulses $20a_3$ and $20b_3$ having a single polarization direction. The polarization direction of laser pulses $20a_2$ and $20b_2$ propagating through the EOM $30a$ is unaffected if the voltage of command signal 48 applied to EOM $30a$ causes it to impart a zero optical retardation voltage to laser pulses $20a_2$ and $20b_2$. Skilled persons will appreciate that a preferred EOM is a tunable birefringent device that, in response to different applied voltages, imparts different amounts of optical retardation to light propagating through it. An EOM driven to impart half-wave optical retardation to incident linearly polarized light of a wavelength to which the EOM is tuned causes the incident light to undergo an effective 90 degree rotation of polarization direction. An EOM driven to impart zero optical retardation to incident linearly polarized light causes it to undergo essentially no change in polarization direction. Although the preferred embodiments described below operate in response to switching an EOM between zero and half-wave optical retardation states, it is the difference of half-wave optical retardation that produces the desired light output states. Therefore, switching an EOM between, for example, minus one-quarter wavelength and plus one-quarter wavelength optical retardation states in combination with appropriate optical retardation plates would produce the desired light output states. Skilled persons will also appreciate that the single polarization direction selected may be determined by or may determine the polarization direction or orientation of one or more downstream components, such as a polarizer $32a$.

In some exemplary embodiments, the laser controller 42 may command EOM driver 50 to cause EOM $30a$ to impart to the combined beam half-wave retardation at a repetition rate or frequency that is the same as the repetition rate that laser controller 42 commands pulse driver 40 to initiate laser pulses 20 from pulsed lasers 20. In some embodiments, command signals 52 applied to EOM driver 50 and command signals $54a$ applied to pulsed laser $14a$ are synchronized such that all of laser pulses $20a_2$ propagating through EOM $30a$ are converted to have the same polarization direction as that of laser pulses $20b_2$, and laser controller 42 instructs EOM driver 50 to apply zero retardation voltage to EOM $30a$ while laser pulses $20b_2$ propagate through EOM $30a$ so that their polarization direction remains unchanged, thereby providing a composite polarized beam 18 having laser pulses $20a_3$ and laser pulses $20b_3$ in the same polarization direction. Alternatively, command signals 52 applied to EOM driver 50 and command signals $54b$ applied to pulsed laser $14b$ are synchronized such that all of laser pulses $20b_2$ propagating through EOM $30a$ are converted to have the same polarization direction as that of laser pulses $20a_2$, and laser controller 42 instructs EOM driver 50 to apply zero retardation voltage to EOM $30a$ while laser pulses $20a_2$ propagate through the EOM $30a$ so that their polarization direction remains unchanged, thereby providing a composite polarized beam 18 having laser pulses $20a_3$ and laser pulses $20b_3$ in the same polarization direction. In either embodiment, EOM $30a$ may be "maintained" at a half-wave retardation voltage to readily impart changes in optical retardation when required and then rapidly switched at an appropriate repetition rate to avoid changes in optical retardation when not required.

Skilled persons will appreciate that for straightforward polarization state change applications, the pulse width of the EOM pulses from EOM driver 50 is preferably greater than the pulse width of laser pulses 20. In some embodiments, the pulse width of EOM pulses may also be greater the sum of a laser pulse width and the jitter time (or twice the jitter time).

Skilled persons will appreciate that, for straightforward polarization state change applications, the composite polarized beam 18 will exhibit a composite repetition rate that is greater than the individual repetition rate of either pulsed laser 14 (or pair of pulsed lasers 14 as later described). Similarly, for straightforward polarization state change applications, the composite polarized beam 18 will exhibit a composite average power that is greater than the individual average power of either pulsed laser 14 (or pair of pulsed lasers 14).

In an example, the pulsed lasers 14*a* and 14*b* are diode-pumped, Q-switched solid-state lasers, each running at a repetition rate of 100 KHz. A 200 KHz external pulse signal from the pulse driver 40 is divided into two 100 KHz signals that alternately drive the Q-switches. The laser pulses 20*a* and 20*b* may be time displaced by about 5 µs (microseconds) or less. Laser pulse time jitter for a conventional diode-pumped solid state laser with a 41 MHz Q-switch may be in the range of 5 ns (nanoseconds) to 30 ns, so the time jitter will be very small compared to the pulse separation period. Laser pulses 20*a* and 20*b*, having orthogonal polarization directions, are combined by beam combiner 24 to produce a combined beam having a repetition rate of 200 KHz with alternating pulses having orthogonal polarization directions. EOM 30*a* is maintained at a half-wave retardation voltage and then switched to a zero retardation voltage when laser pulses 20*a* propagate through it to provide a 200 KHz composite polarized beam 18 having the same polarization direction as that of laser pulses 20*b*. The composite polarized beam effectively provides twice the average power and twice the repetition rate of either pulsed laser 14.

Some conventional EOM drivers 50 are characterized by an operating voltage up to about 10 KV (kilovolts), a repetition rate up to about 3 MHz, an optical switch time as short as 1.5 ns, a variable pulse width, and input-output jitter of less than 200 ps. With driver improvements or use of additional EOM drivers 50, skilled persons would appreciate that EOM 30*a* can theoretically provide EOM pulses at up to about a 10 MHz repetition rate with an EOM pulse width, such as 100 ns, that is greater than the laser pulse time jitter. With scaling and pulse energy equalization as later described, 500 KHz or faster solid state lasers are facilitated. The composite polarized beam can be harmonically converted if desired.

With reference again to FIG. 1, a harmonic generator or converter 58, such as one or more nonlinear crystals, may be positioned along combined beam path 16, preferably downstream of EOM 30*a* and downstream of polarizer 32*a*, if it is present. Skilled persons will appreciate that pulsed lasers 14 may be adapted to emit harmonic wavelengths, such as by intracavity conversion. However, there may be advantages to converting the wavelengths after laser pulses 20*a* and 20*b* are combined into a composite beam. Depending on the hardiness or other properties of the harmonic converter crystals, a single harmonic converter 58 may be positioned downstream of most or all of the beam combiners 24 positioned along the combined beam path 16.

Figure 2:
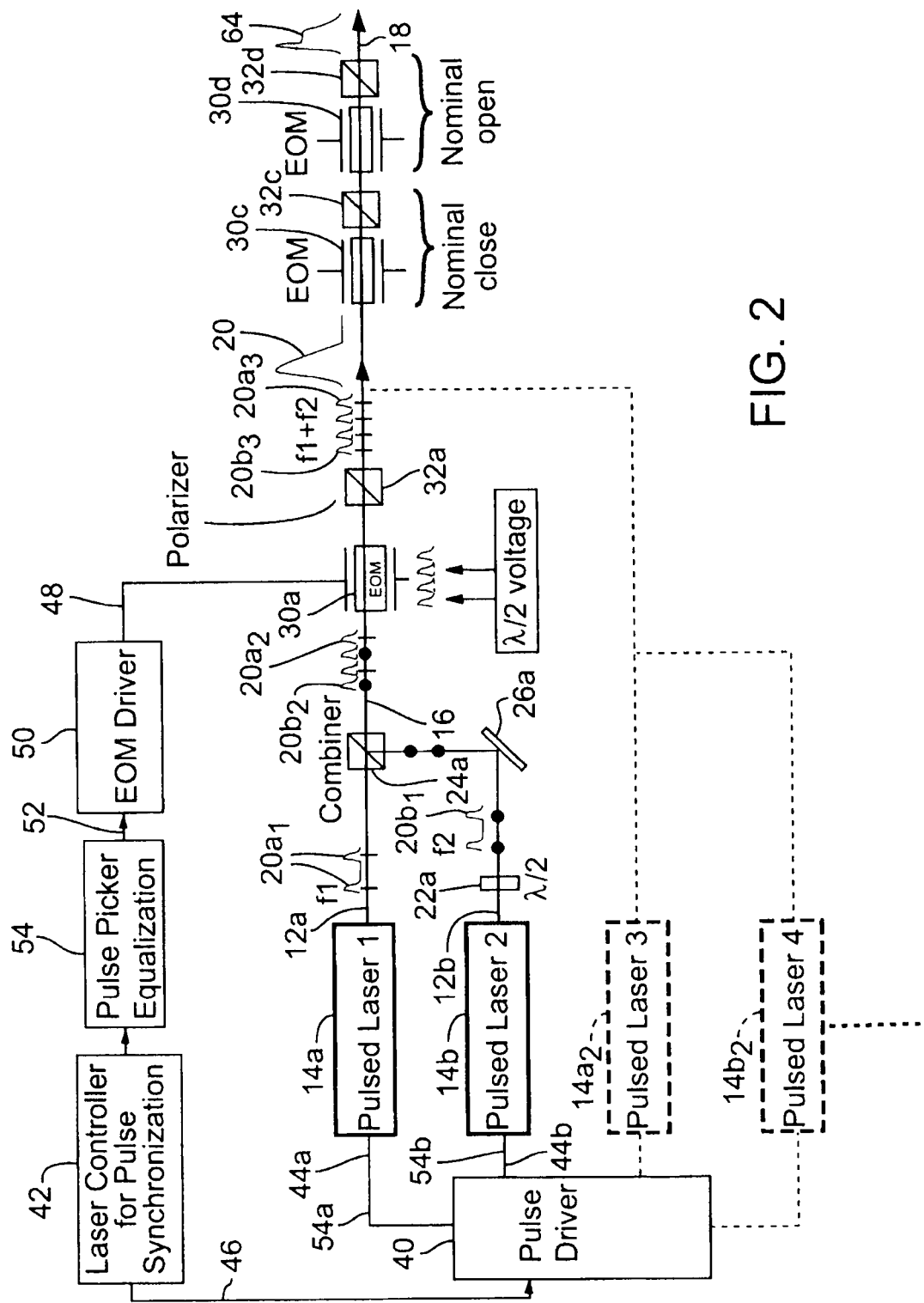
FIG. 2 is a block diagram of an exemplary pulse picking laser system for providing a composite polarized beam with optionally shaped pulses.

With reference to FIGS. 1 and 2, laser systems 10 and 60 may employ a polarizer 32*a*, positioned along the combined beam path downstream of EOM 30*a*, in coordination with optical retardation changes provided by EOM 30*a* to block any selected laser pulse 20 from propagating to a work piece (not shown). In exemplary embodiments, polarizer 32*a* may be an absorptive polarizer selected to pass only laser pulses 20 that are in the same polarization state as that of composite polarized beam 18.

In some implementations, laser controller 42 may coordinate EOM pulses responsive to a constant repetition rate command to be in coincidence with lasers pulses 20 from one of the pulsed lasers 14, having for example an s-polarization state to provide the composite polarized beam 18 of both laser pulses 20*a* and 20*b* having a p-polarization state that propagates through polarizer 32*a*. Laser controller 42 or an optional a pulse picking subcontroller 54 may be adapted to be to provide an interrupt command (which may be superimposed over the constant repetition rate command) that causes EOM 30*a* to provide no polarization change to any selected laser pulse having the s-polarization so that the downstream polarizer blocks the selected laser pulse 20. Conversely, laser controller 42 or pulse picking subcontroller 54 may additionally or alternatively be adapted to provide a proactive optical retardation-change command to apply retardation change voltage to EOM 30 to prevent any selected laser pulse 20 previously having the p-polarization from propagating through polarizer 32*a*.

In some alternative implementations, polarizer 32*a* may be adapted to block laser pulses 20 from one of pulsed lasers 14, having for example an p-polarization state, that are not subjected to optical retardation change by the EOM 30*a*; and laser controller 42 may coordinate EOM pulses responsive to a constant repetition rate command to be in coincidence with lasers pulses 20 from one of pulsed lasers 14, having for example an s-polarization state to consistently prevent such pulses from propagating through polarizer 32*a*. In this implementation, the proactive optical retardation-change command initiates EOM retardation change to cause a selected previously p-polarized laser pulse to propagate through polarizer 32*a*; and the interrupt command prevents EOM retardation change to allow the selected initially s-polarized laser pulse to propagate through polarizer 32*a*.

Skilled persons will appreciate that pulse picking control may be responsive to position data. Such data might, for example, indicate the location of an IC link to be severed. Skilled persons will also appreciate that a variety of control schemes and electronics could be employed to implement pulse picking using EOM 30*a* and polarizer 32*a* and coordinate or synchronize pulse picking with laser pulse initiation. For example, the pulse picking control may be an integrated portion of laser controller 42. Skilled persons will additionally appreciate that a downstream AOM could alternatively be employed to perform pulse picking to the extent that such AOM could be operated fast enough to handle the repetition rate of working laser pulses (pulses requested to propagate to a work piece).

With reference again to FIG. 1, the laser system 10 and any of the subsequently described laser systems can easily be scaled up to increase the composite repetition rate and the composite average power. In some exemplary embodiments, scaling up can be implemented by adding one or more sets of a pulsed laser 14, a beam combiner 24, an EOM 30, an optional fold mirror(s) 26, and an optional polarizer 32. In some embodiments, scaling up may be accomplished by adding single sets containing a single laser 14 or paired sets containing pairs of lasers 14, or combinations thereof. Thus, the laser system 10 could be scaled up with odd numbers of lasers, and the composite average power may approximate any multiple of average powers. The additional set components may be the same types of components supporting the basic laser system 10, or the additional set components may be different types or have different properties from those used in the basic laser system 10. For example, the additional sets may provide different wavelengths, pulse widths, average powers, repetition rates, or beam waists, for example.

For example, a pulsed laser 14*a*$_2$ emits laser pulses 20*c* that propagate along a beam path 12*a*$_2$ intersecting a beam combiner 24*b* that is also positioned along combined beam path 16*a* downstream of EOM 30*a*. Beam combiner 24*b* may be positioned either downstream or upstream of polarizer 32*a*$_2$, depending on design choice and intended system applications. In either case, an additional EOM 30*b* is positioned downstream of beam combiner 24*b*. If beam combiner 24*b* and EOM 30*b* are positioned upstream of polarizer 32*a*, then an additional polarizer 32*b* downstream of EOM 30*b* may be redundant. However, if beam combiner 24*b* and EOM 30*b* are positioned downstream of polarizer 32*a*, then an additional polarizer 32b downstream of EOM 30b may be desirable to facilitate pulse picking functions of EOM 30b. EOM 30b may be responsive to an independent EOM driver (not shown) that receives commands from laser controller 42 and optional pulse picking subcontroller 54, or EOM 30b may be responsive to a command signal 48b produced by a shared EOM driver 50. The pulsed laser may be responsive to a separate pulse driver or may be responsive to pulse driver 40.

In basic operation, composite polarized beam 18 can be treated like the output of a single pulsed laser with respect to the EOM 30b, and laser pulses 20c can be treated like those of a second pulsed laser. Skilled persons will appreciate however that laser pulses 20c may be alternated with the laser pulses of composite polarized beam 18 (four pulses per cycle), or laser pulses 20c may be placed in a rotation with laser pulses 20a and 20b (three pulses per cycle). Laser controller 42 can coordinate pulse driver(s) 40, EOM driver(s) 50, and optional pulse picking subcontroller(s) 54 to achieve either scenario.

In an exemplary embodiment not shown, second and subsequent additional sets of a pulsed laser 14, a beam combiner 24, an EOM 30, an optional fold mirror(s) 26, and an optional polarizer 32 can be added in a configuration where each beam combiner intersects combined beam path 16 in the same manner as previously described.

In other exemplary embodiments, such as shown in dashed lines in FIG. 1, additional sets can be added in pairs. For example, pulsed laser $14a_2$ emits laser pulses 20c propagating along beam path $12a_2$ that intersects beam combiner $24a_2$, and a pulsed laser $14b_2$ emits laser pulses 20d propagating along beam path $12b_2$ that intersects beam combiner $24a_2$, which may function exactly as beam combiner 24a, to propagate laser pulses 20c and 20d along combined beam path 16a to intersect an EOM $30a_2$. EOM $30a_2$, in response to a command signal 48a produced by EOM driver 50, functions as EOM 30a to change the polarization direction of either laser pulses 20c or laser pulses 20d to provide a composite polarized beam 18b that may intersect an optional polarizer $32a_2$.

Laser pulses 20c and 20d propagate as composite polarized beam 18b (having an orthogonal polarization direction to that of composite polarized beam 18) along beam path 16b to intersect beam combiner 24b that is also positioned along combined beam path 16 downstream of EOM 30a. As discussed earlier, beam combiner 24b may be positioned either downstream or upstream of polarizer 32a, depending on design choice and intended system applications. In either case, additional EOM 30b is positioned downstream of beam combiner 24b. If beam combiner 24b and EOM 30b are positioned upstream of polarizer 32a, then an additional polarizer 32b downstream of EOM 30b may be redundant. However, if beam combiner 24b and EOM 30b are positioned downstream of polarizer 32a, then an additional polarizer 32b downstream of EOM 30b may be desirable to facilitate pulse picking functions of EOM 30b. Skilled persons will appreciate however that EOM 30b need not be used for pulse picking functions if such functions are performed by EOM 30a and EOM $30a_2$. EOMs $30a_2$ and 30b may be responsive to an independent EOM driver (not shown) that receives commands from laser controller 42 and optional pulse picking subcontroller 54, or EOMs $30a_2$ and 30b may be responsive to a shared EOM driver 50. The pulsed lasers $14a_2$ and $14b_2$ may be responsive to a separate pulse driver or may be responsive to pulse driver 40.

In basic operation, composite polarized beams 18 and 18b can be treated like the output of respective single pulsed lasers with respect to EOM 30b, such that sets of laser pulses $20a_3$ and $20b_3$ are alternated with sets of laser pulses 20c and 20d.

Alternatively, the laser pulses may be placed in an interweaved rotation, such as a sequence having laser pulses $20a_3$, 20c, $20b_3$, and 20d. Laser controller 42 can coordinate the pulse driver(s) 40, EOM driver(s) 50, and optional pulse picking subcontroller(s) 54 to achieve either scenario. EOMs 30 can also be used to provide pulse equalization and pulse shaping and act as a high speed shutter or system trigger as later described.

FIG. 2 shows an exemplary laser system 60 for providing a composite polarized beam 18 with shaped pulses. With reference to FIGS. 1 and 2, laser system 60 includes many components corresponding to those shown in FIG. 1. For convenience, the corresponding components have been labeled with the same reference numerals; however, most of the components in the scaling set have been omitted for simplicity.

With reference to FIG. 2, one or both of EOMs 30c and 30d, paired with respective polarizers 32c and 32d may be used to provide the pulse picking functions of EOM 30a, if desirable. Alternatively, EOMs 30a, 30c, and 30d may each be employed for a separate function, wherein for example, EOM 30a is employed for polarization state phase change to effect beam combination, EOM 30c is employed for pulse picking, and EOM 30d is employed for pulse shape tailoring (also called pulsed shaping) of the propagated laser pulses 20 in composite beam 18 to provide shaped or tailored pulses 64.

Skilled persons will appreciate that all three functions of beam combination, pulse picking, and pulse shaping may be performed by a single EOM 30a. However, skilled persons are also aware that different types of electro-optical crystal cells 62 (FIG. 5) employed in EOMs 30a, 30c, and 30d have different properties, and some electro-optical crystal cells 62 will be better suited for some applications than others as later described. Different EOMs 30 or different types of EOM 30 may be responsive to a single EOM driver 50 or separate EOM drivers 50 of the same or different types. In some embodiments, EOM drivers 50 are selected based on the driving voltage and frequency suitable for the EOM crystal type.

Figure 3:
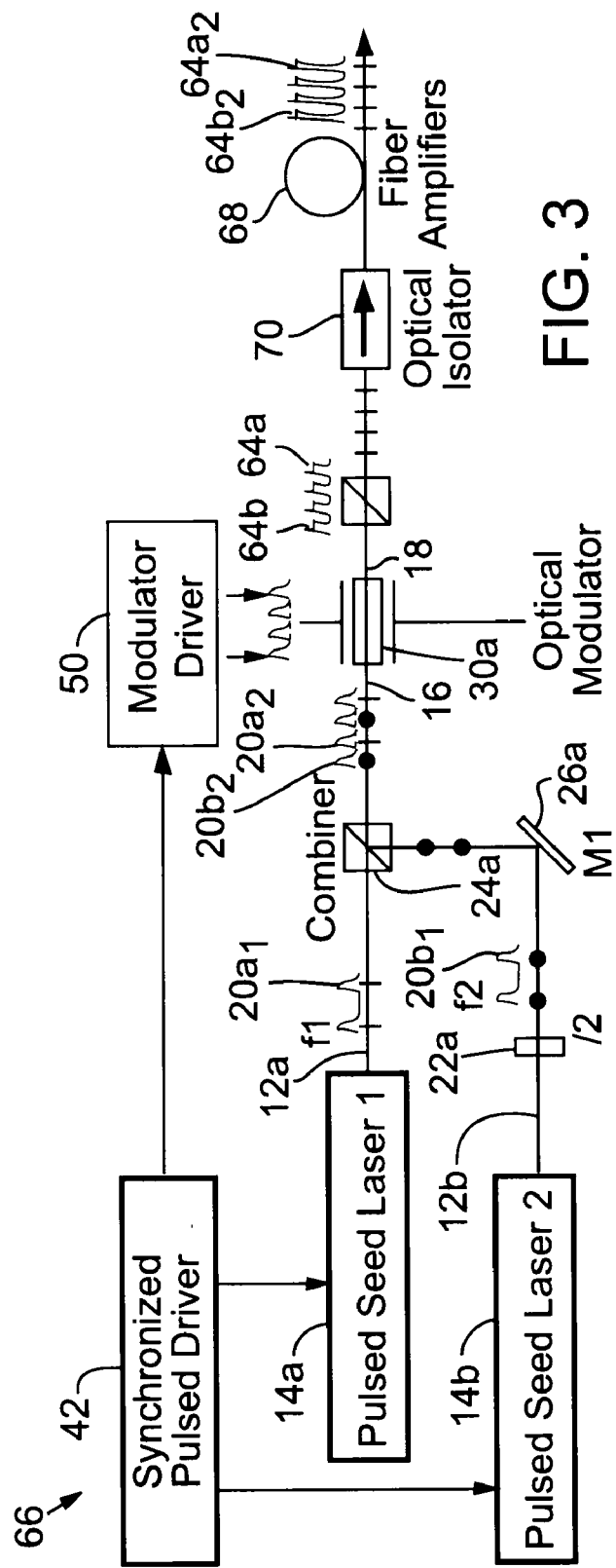
FIG. 3 is a block diagram of an exemplary scalable master oscillator power amplifier (MOPA) system employing multifunctional capabilities of an optical modulator including beam combination.

FIG. 3 shows an exemplary scalable master oscillator power amplifier (MOPA) laser system 66 employing multifunctional capabilities of an optical modulator 30a including beam combination and pulse picking (and optionally beam shaping). With reference to FIG. 3, laser system 66 includes many components corresponding to those shown in FIGS. 1 and 2. For convenience, the corresponding components have been labeled with the same reference numerals; however, the components for scaling have been omitted for simplicity.

With reference to FIG. 3, laser system 66 employs a MOPA configuration in which pulsed lasers 14a and 14b are seed lasers whose output is directly or eventually directed through a power amplifier 68, such as a fiber amplifier. Seed lasers, power amplifiers 68, and MOPA configurations are well known to skilled practitioners, and several examples employing these components are describe later in detail. Exemplary pulsed seed laser sources include, but are not limited to, pulse modulated narrow bandwidth LED sources, semiconductor lasers, laser diodes, solid-state lasers, and fiber lasers. Exemplary power amplifiers 68 include, but are not limited to, fiber amplifiers, photonic crystal fiber amplifiers, solid-state amplifiers, or hybrids thereof.

The synchronizing functions of laser controller 42 and pulse driver 40 may be integrated into a synchronized pulse driver that delivers commands directly or indirectly to pulsed lasers 12 and optical modulator 30a. Laser system 66 also preferably employs an optical isolator 70, which permits the transmission of light in only one direction.

Skilled persons will appreciate that some pulse shaping can be performed by modulating the power supplied to the seed lasers. However, optical modulator 30a (or EOMs 30c and/or 30d, not shown in this figure) can be employed to provide shaped pulses 64a and 64b and their respective amplified, shaped output pulses $64a_2$ and $64b_2$. Modulation of the seed laser power supply may also be coordinated with EOM pulse shaping techniques to effect hybrid pulse shapes.

Skilled persons will appreciate that power amplifier 68 may be positioned at a different location, such as along beam paths 12, beam path 16, or downstream of the optical modulator 30a before or after polarizer 32a. The power amplifier may alternatively be integrated into a pulsed laser module.

In one example, a Q-switched solid-state laser, such as Nd:YVO$_4$, is selected as a pulsed seed laser having a pulse width from a few nanoseconds to tens of nanoseconds. Maximum pulse repetition rate with stable pulse-to-pulse stability of a conventional Q-switched diode-pumped Nd:YVO$_4$ is about 500 KHz due to relatively low gain. To effectively increase the pulse repetition rate, the beam combiner 24a and optical modulator 30a can be used to sum the repetition rate of the pulsed lasers 14a and 14b. The optical modulator 30a, such as a fiber-coupled Mach-Zehnder interferometer (having a modulation bandwidth up to 40 GHz and greater, such as devices manufactured by EOspace, Inc. in Seattle Wash.), adjusts the orthogonal polarizations of pulses 20a and 20b into a linearly polarized beam of both pulses while also shaping the pulses to have a desired temporal pulse shape for advantageously processing materials.

The seed laser wavelength covers from 970 nm to 1200 nm corresponding to the emission bandwidth of Yb-doped glass, from 1.4 µm to 1.6 µm of Er-doped fiber, or other wavelength ranges of rare earth-doped fibers. The pulsed seed laser source is not limited to a Q-switched nanosecond solid-state laser. The seed lasers may include, but are not limited to, mode-locked solid-state lasers, semiconductor lasers, fiber lasers, or pulsed seed laser diodes. Modulation of a distributed feedback (DFB) seed laser diode is one method of achieving a high frequency laser. However, the modulation pulse rate of the seed laser diode is limited by a few of factors, such as relaxation resonance frequency, damping frequency, parasitic elements, spectrum broadening, spectrum chirp, harmonic and intermodulation distortions. A beam combiner 24a with an EOM 30a can avoid these problems and can increase the pulse repetition rate by multiplying the number of seed diodes.

Figure 4:
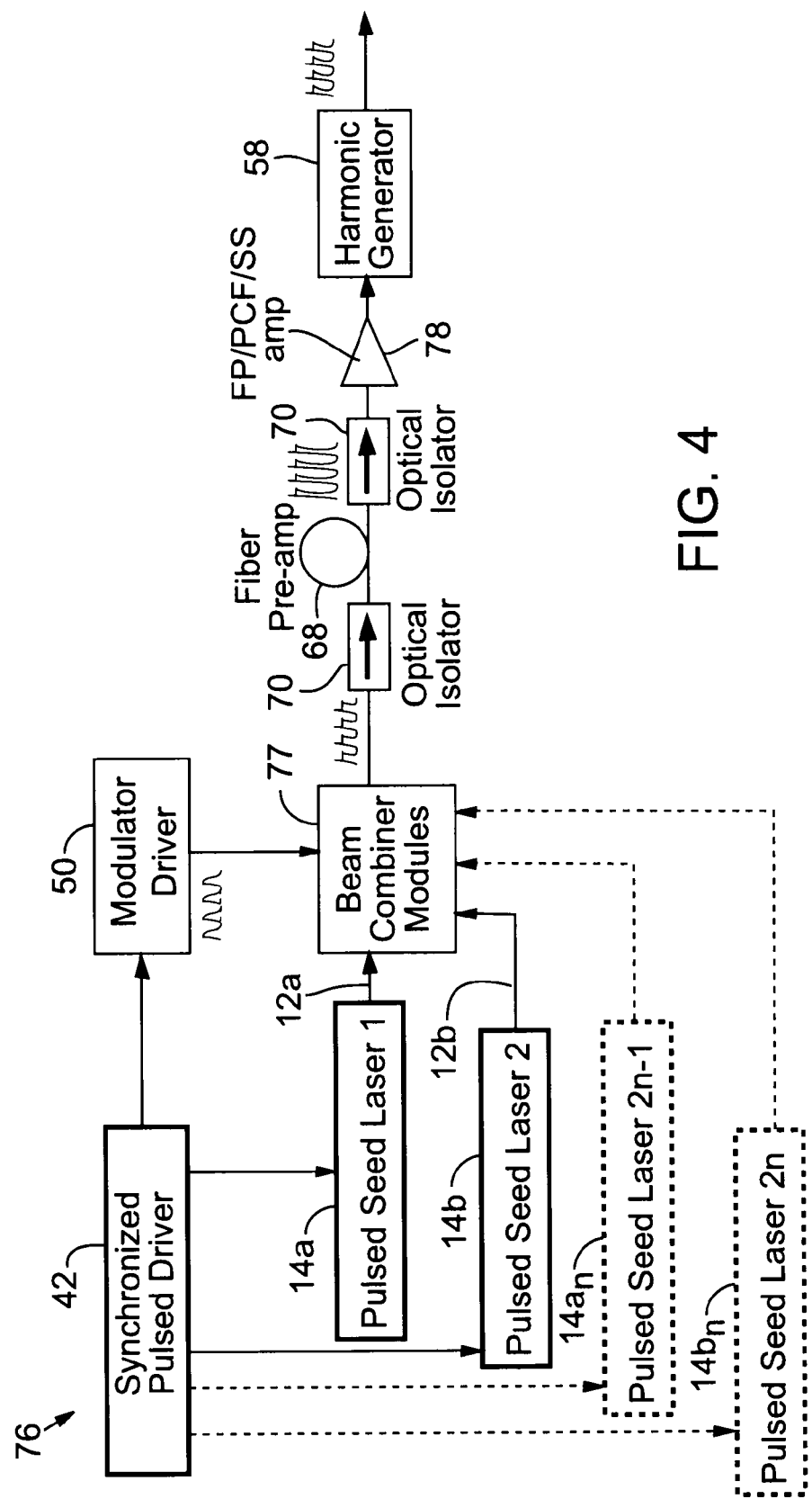
FIG. 4 is a block diagram of an alternative exemplary scalable MOPA system employing multifunctional capabilities of an optical modulator including beam combination.

FIG. 4 shows an alternative exemplary scalable MOPA laser system 76 employing multifunctional capabilities of an optical modulator 30a including beam combination and pulse picking (and optionally beam shaping). FIG. 4 is similar in many respects to FIG. 3; therefore, for convenience, many of the corresponding components have been labeled with the same reference numerals. Also for convenience, the sets of beam combiners 24 and optical modulators 30 have been represented by a single block labeled beam combiner modules 77, and the intricacies of the respective beam paths have been omitted.

The laser system 76 additionally employs a fiber power/photonics crystal fiber/solid state (FP/PCF/SS) optical amplifier 78 downstream of (fiber) power amplifier 68 and an additional optical isolator 70. Laser system 76 may also preferably employ a fiber-based interferometer 30a as the optical modulator 30a. With reference to FIGS. 3 and 4, the power amplifiers 68 or preamplifiers 68 may be employed in single stages or in multiple stages.

Laser system 76 also employs a harmonic converter 58 that is positioned downstream of the FP/PCF/SS optical amplifier 78. Skilled persons will recall that harmonic converter 58 may alternatively be positioned at various places along the numerous beam paths as previously mentioned. Some examples of alternative harmonic generation position, as well as some reasoning advocating for alternatives, are presented later in conjunction with discussion of EOM operations.

Figure 5:
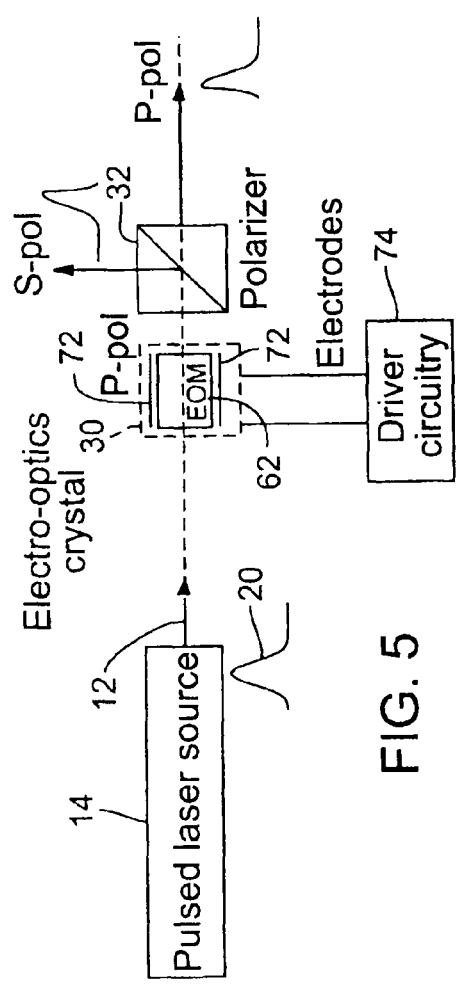
FIG. 5 is a simplified block diagram of an electro-optical modulator operating as a laser pulse slicing device in the production of tailored laser pulse output.

FIG. 5 shows an EOM 30 that can be implemented in a number of laser pulse slicing system embodiments described below to produce tailored laser pulse output. EOM 30 includes an electro-optical crystal cell 62 that receives a polarized beam of laser pulses 20 emitted by a pulsed laser source 14. Electro-optical crystal cell 62 has electrodes 72 to which drive output signals of driver circuitry 74 of EOM driver 50 are applied to contribute to shaping of incident laser pulses 20.

The EOMs 30 can be made of KDP, KD*P, ADP, AD*P, RTP, RTA, BBO, LiNbO$_3$, or other electro-optical materials that preferably operate at high repetition rates or frequencies. EOMs 30 are commonly available optical elements well known to skilled practitioners. Preferred forms of EOMs 30 in some embodiments include Pockels cells. Some exemplary EOMs 30, as well as additional exemplary EOM applications are discussed in further detail.

One example of a suitable electro-optical crystal cell 62 is a LightGate 4 BBO Pockels cell manufactured by Cleveland Crystals, Inc., Highland Heights, Ohio. The LightGate 4 cell can operate at 100 KHz, and its geometry minimizes the drive voltage to about 1.3 KV quarter-wave retardation at 355 nm. The LightGate 4 cell has only 4 pf capacitance, which provides a possibility of less than 2 ns rise and fall optical response times. One example of suitable driver circuitry 74 is a high-voltage, fast switching time Pockels cell driver that is available from Bergmann Messegeraete Entwicklung, KG, Murnau, Germany. This Pockels cell driver may have some or all of the capabilities of the exemplary EOM driver 50 that has been previously described.

A BBO based EOM 30 operates as a quarter-wave rotator in response to a quarter-wave drive voltage applied to electrodes 72 of the BBO cell. Laser pulses 20a, for example, are p-polarized (p-pol) as shown and travel once through the BBO crystal cell. When no drive voltage is applied to electrodes 72 of the BBO crystal cell, the laser pulses remain in the p-pol state and pass through polarizer 32. When a quarter-wave drive voltage at the laser wavelength is applied to electrodes 72 of the BBO crystal cell, the polarization direction of the beam rotates 90 degrees and become s-polarized (s-pol). When a drive voltage applied to electrodes 72 of the BBO crystal cell is between 0 and the quarter-wave voltage, the portion of polarized laser pulses 20a transmitted from polarizer 32 is approximately expressed as $$T=\sin^2[(\pi/2)(V/V_{1/2})],$$

where T is the transmission of the laser beam from polarizer 32, V is the voltage applied to electrodes 72 of electro-optical crystal cell 62, and $V_{1/2}$ is the half-wave voltage.

Figure 6:
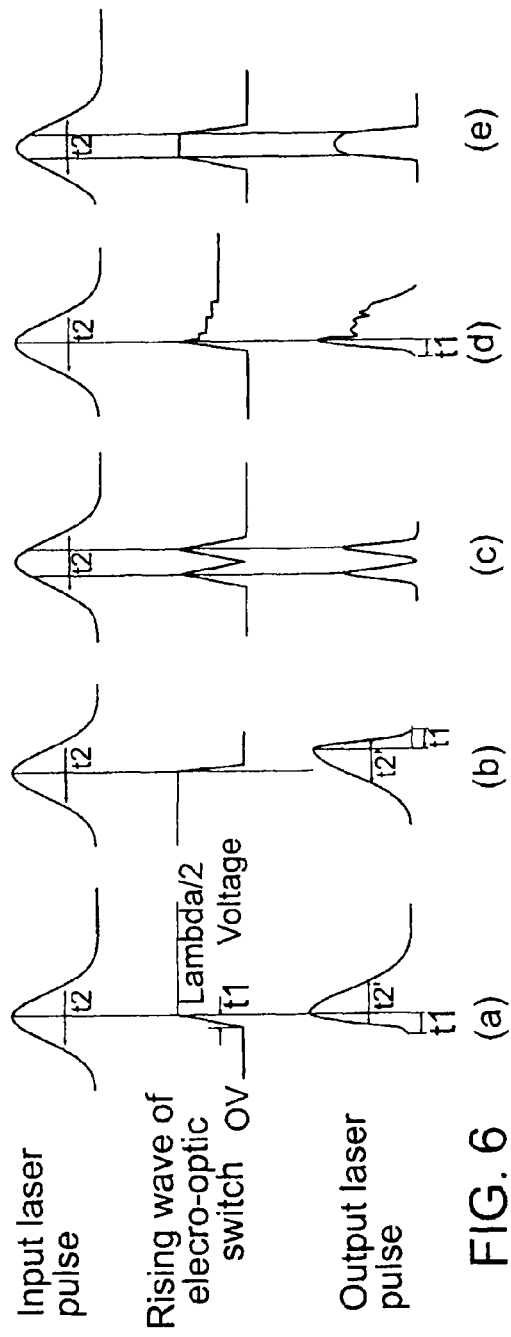
FIG. 6 shows in columns (a), (b), (c), (d), and (e) examples of five possible laser pulse shape formations produced by the laser pulse slicing device of FIG. 5.

Based on the above expression, the controllable transmission, T, of EOM 30 provides a laser pulse shaping function. Theoretically, the transmission of electro-optical crystal cell 62 and polarizers 30 can be about 0%-100%. FIG. 6 shows five examples of possible laser pulse shapes. These examples represent modifications of laser pulses 20 having a single polarization state, such as laser pulses 20a, that is conserved in the combined polarized beam 18. Skilled persons will appreciate however that for laser pulses having the orthogonal polarization state, such as laser pulses 20b, the EOM voltage modifications would be inverted (such as subtractive rather than additive) to obtain similar output pulse shapes. So, by applying the inverted EOM driver waveforms, every laser output pulse of the composite polarized beam could acquire the same tailored pulse shape.

FIG. 6 shows as column (a) one example of pulse shaping, in which the transmission changes from 0% to 100% with less than a 2 ns rise time for the laser pulse to reach its peak and thereby provide a fast rising leading edge of the laser pulse. Skilled persons will recognize that in an alternative arrangement, known to the art as a double-pass configuration, a quarter-wave voltage may be employed to achieve a desired level of polarization rotation but that this improved efficiency is gained at the expense of greater optical alignment complexity.

Rise and fall times are related to the voltage and capacitance of the electro-optical cell, the switching time of drive circuit transistors, the repetition rates, and overall electrical power consumption. Lower voltage and capacitance of the electro-optical cell contribute to its fast response time; therefore, selection of a proper material for the electro-optical cell is important. Skilled persons will recognize that BBO and RTP exhibit useful material characteristics for implementation in electro-optical modulators. Koechner, Solid-State Laser Engineering, Springer-Verlag, states, for a longitudinal electro-optical cell in which the electric field is applied parallel to the crystal optic axis and in the same direction as the incident light, that phase difference, δ, is related to the applied voltage in a crystal of length, I, by $$\delta = (2\pi/\gamma) n_0^3 r_{63} V_z,$$

where $V_z = E_z I$.

To obtain half-wave retardation, a Pockels cell produces a phase difference $\delta = \pi$. In this case, for linearly polarized light incident on the Pockels cell, the output beam is also linearly polarized but with a plane of polarization rotated by 90 degrees. By incorporation of polarizing optics well known in the art, the Pockels cell can function as a voltage-controlled optical modulator. Koechner expresses the transmission, T, dependence of such a device as:

$$T = \sin^2[(\pi/2)(V/V_{1/2})],$$

where the half-wave voltage is given by $V_{1/2} = \lambda/2 n_0^3 r_{63}$.

For a transverse electro-optical crystal cell, in which the electric field is applied perpendicularly to the direction of the beam, the half-wave voltage is given by $$V_{1/2} = \lambda d / 2 n_0^3 r_{63} I.$$

This type of electro optical crystal cell has the useful attribute that the half-wave voltage depends on the ratio of crystal thickness to length and, by proper selection of these parameters, electro optical crystal cells may be designed that operate at lower applied voltages than those applied to longitudinal electro optical crystal cells to achieve a given phase difference.

Skilled persons will recognize that the term $r_{63}$ in the above equations represents the electro-optic coefficient for phosphates of the KDP family. RTP crystal is a commonly used member of this family and is a preferred electro-optical crystal material for some preferred embodiments for use with 1064 nm laser input. For some preferred embodiments BBO crystal is preferably used with 355 nm laser input.

RTP crystal has a low voltage requirement (about 1.6 KV for π or half-wave retardation and a 3.5 mm aperture) for 1064 nm laser input and can operate to a 10 MHz repetition rate. RTP crystal cannot perform well when the average power is generally more than 10 W or is not suitable for UV applications because of transparency restrictions. For these latter applications as noted above, BBO is preferred. In practice, it is difficult to drive BBO at 100 KHz for 1064 nm laser because of the high voltage requirement (about 6 KV at half-wave retardation). Therefore, the RTP electro-optical crystal cell is the currently preferred choice for a 1064 nm laser, and the BBO electro-optical crystal cell is preferred for 355 nm laser (about 1.3 KV at half-wave retardation for a LightGate 4 BBO Pockels cell). Other electro-optical materials, such as KDP, RTA, and ADP, have main limitations on use at high repetition rates and pulse modulation because of piezo-electric (PE) resonances. Faster rise and fall times result in higher frequency components, so there is a greater chance that one of these frequency components will fall into the principal resonance frequencies. This is especially true of a fast rise time tailored pulse, which contains many frequency components that extend in frequency well above the fundamental repetition rate.

To generate tailored pulse shapes, the preferred embodiments described are implemented with a "fast multi-state" (FMS) electro-optical modulator that is designed to avoid PE resonances. For 1064 nm laser output, this is accomplished by using an electro-optical cell made of RTP crystal material and short electrical pulses, which do not generate significant PE resonances. Pulse lengths on the order of nanoseconds result in relatively low PE resonances. For example, an RTP electro-optical crystal cell can reach a repetition rate of 10 MHz for 5% duty cycle pulses.

Another concern of obtaining fast rising and falling time is the design of the electro-optical modulator driver. There is no actual limitation of an electro-optical crystal cell preventing it from producing sub-nanosecond or picosecond switching times; therefore, a fast switching time depends mainly on the electrical driver. Skilled persons recognize that there are two principal types of electrical switchers: avalanche transistor and MOSFET. The transistors operate within a very limited voltage range to attain the fastest switching time. A stack of 7 to 10 transistors may be used to operate in the 1.6 KV range. Avalanche transistors can achieve a 2 ns switching time, but their repetition rates are limited to less than 10 KHz. For higher repetition rates, MOSFETs are currently preferred, because, generally, they have a 1 ns response time and maximum 1 KV operating voltage. A stack of at least 2 to 3 MOSFETs is used to operate in the 1.6 KV range.

The selection of MOSFETs and circuit design are, therefore, germane to accomplish FMS pulse modulation. In particular, the driver circuit power consumption is of concern because it is proportional to the square of the peak operating voltage. For example, a BBO electro-optical cell operating at about 6 KV requires approximately 14 times as much power consumption as that of an RTP electro-optical cell operating at 1.6 KV to achieve a comparable phase shift at a given repetition rate. Skilled persons will recognize that lowering the operating voltage reduces the power consumption. It is possible to reduce the number of MOSFETs, which in turn provides better performance of FMS pulse modulation through judicious choice of the aperture size and resulting drive voltage. In a preferred embodiment of a transverse electro-optical modulator, a reduction in the apertures of RTP and BBO electro-optical crystal cells to about 2 mm gives corresponding reductions in half-wave retardation voltages to about 800 V and 4 KV at 1064 nm, for RTP and BBO electro-optical crystal cells, respectively.

An FMS electro-optical modulator is capable of multiple programmable steps of modulation, in which each step has a rise time of preferably less than about 4 ns and a fall time of preferably less than about 4 ns, and more preferably, in which each step has a rise time of preferably less than about 2 ns and a fall time of preferably less than about 2 ns. An operational advantage of the disclosed embodiments is that they provide a tailored pulse shape that may be programmed to have more than one amplitude value. Another such operational advantage is the capability of providing programmable tailored pulse shapes with discrete amplitude and time duration components. Such capability is particularly useful in the production of tailored pulse output with a pulse shape of the type shown in FIG. 6(a). This pulse shape has, with respect to the first amplitude maximum, a total fall time that is substantially longer than the rise time to the first amplitude maximum.

Exemplary embodiments of the laser systems described herein can generate tailored harmonic output pulse shapes from fundamental or harmonic laser pulse input of substantially Gaussian, rectangular, or trapezoidal pulse shapes. As mentioned earlier, the harmonic converter or module 58 may form part of the pulsed lasers 12, may be extra cavity but upstream of the beam combiner 24a, between the beam combiner and the EOM 30a, downstream of the EOM 30a, or downstream of EOMs 30c or 30d. Such tailored harmonic pulse shape output may be advantageously employed to sever electrically conductive link structures in a wide array of semiconductor memory devices, including DRAM, SRAM, and flash memory; to produce laser drilled micro-vias in flexible circuits, such as copper/polyamide layered materials, and in integrated circuit (IC) packages; to accomplish laser processing or micromachining of semiconductors, such as laser scribing or dicing of semiconductor integrated circuits, silicon wafers, and solar cells; and to accomplish laser micromachining of metals, dielectrics, polymeric materials, and plastics.

FIG. 7 shows an exemplary implementation of a laser system 80 using pulsed harmonic laser sources 14c. The pulsed harmonic laser sources 14c may be a diode-pumped, Q-switched Nd:YVO$_4$ master oscillator 82 operating at 1064 nm, the output (denoted schematically as $\lambda_1$(t)) of which is amplified in a diode-pumped Nd:YVO$_4$ amplifier 68, also operating at 1064 nm. The amplified 1064 nm output (denoted schematically as $\lambda_1$, P$_2$(t)) is subsequently frequency converted to 355 nm in an extracavity harmonic converter module 58 (downstream of the amplifier 68 and upstream of EOM 30a) the output of which is denoted schematically as $\lambda_2$, P$_3$(t). Extracavity harmonic module 58 includes an optional first focusing lens; a Type I, non-critical phase-matched LBO cut for 1064 nm to 532 nm conversion; an optional second focusing lens; and a Type II, sum frequency generation LBO crystal cut for 1064 nm plus 532 nm to 355 nm harmonic conversion. This exemplary configuration includes steering optics and dichroic beam splitting elements, of which configurations and implementation methods are well known to skilled persons. The output (denoted schematically as $\lambda_2$, P$_3$(t)) of each pulsed harmonic source 14c is coupled into FMS EOM 30 to produce tailored pulse shape output (denoted schematically as $\lambda_2$, P$_4$(t)) at a third harmonic wavelength of 355 nm.

Skilled persons will recognize that an FMS EOM 30 can operate efficiently at harmonic wavelengths because the applied voltage for the same polarization change is one-half for the second harmonic and one-third for the third harmonic. This effect allows the beneficial reduction of rise and fall times with respect to similar systems operating at the fundamental wavelength because the rise time of the drive voltage is slow-rate limited and modulation of shorter wavelength is achieved at lower drive voltages.

FIG. 8A shows a simplified block diagram of an exemplary laser system 84a employing an FMS EOM 30 (upstream of the power amplifier 68) and fundamental pulsed laser sources 14d in cooperation with a harmonic modulator 58 (downstream of the amplifier 68 and the EOM 30a) to produce a desired output by nonlinear conversion of a shaped laser pulse. The pulsed laser sources 14d operating at a first center or fundamental wavelength deliver substantially Gaussian, rectangular, or trapezoidal pulse shape output (denoted schematically as $\lambda_1$, P$_1$(t)) to FMS EOM 30. FMS EOM 30 is programmed to modify the input pulse shape to a first tailored pulse shape output (denoted schematically as $\lambda_1$, P$_2$(t)) that is suitable for subsequent amplification by a diode-pumped Nd:YVO$_4$ power amplifier 68 and subsequent conversion to harmonic output. To generate the harmonic output, an amplified fundamental wavelength tailored pulse shape output (denoted schematically as $\lambda_1$, P$_3$(t)) produced by diode-pumped power amplifier 68 operating at 1064 nm is delivered to a harmonic conversion module 58. Harmonic conversion module 58 converts amplified fundamental wavelength tailored pulse shape output to harmonic tailored pulse shape output (denoted schematically as $\lambda_2$, P$_4$(t)) at a second center or harmonic wavelength of 355 nm. As shown in FIG. 8A, because of the characteristics of the harmonic conversion process, the conversion of $\lambda_1$, P$_3$(t) to $\lambda_2$, P$_4$(t) depends strongly on the temporal dependence of the pulse shape amplitude, as is well known to skilled persons. Skilled persons will recognize that second, fourth, or fifth harmonics may be produced through alternative arrangements of optical elements and harmonic crystals. Harmonic conversion processes are described in V. G. Dmitriev, et al., *Handbook of Nonlinear Optical Crystals*, pp. 138-141. In an alternative embodiment, diode-pumped power amplifier 68 may be replaced by a diode-pumped large mode area fiber power amplifier or a diode-pumped photonic crystal fiber power amplifier.

Figures 2, 8B:
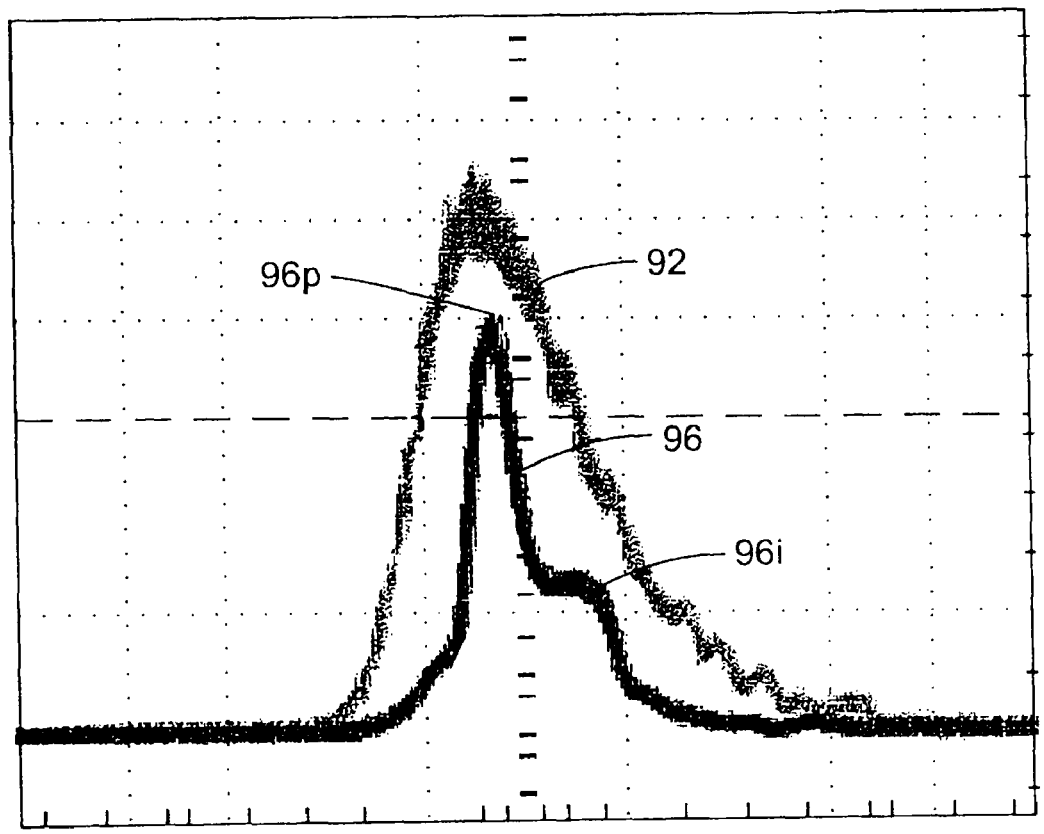

FIG. 8B-1 shows, as a first alternative embodiment, a laser system 84b in which the first tailored fundamental output of FMS EOM 30 is directly coupled into harmonic conversion module 58 without amplification. A description of this temporal dependence effect is given in V. G. Dmitriev, et al., *Handbook of Nonlinear Optical Crystals*, pp. 1-51. Applicants refer specifically to FIG. 2.13, which is illustrative of the dependence of harmonic pulse shape generation on the input pulse shape temporal amplitude distribution. FIGS. 8B-2 and 8B-3 depict different pairs of three oscilloscope screen traces superimposed to show the laser output pulse waveforms 92, 94, and 96 of, respectively, pulsed laser source 14d, FMS EOM 30, and harmonic conversion module 56 of FIG. 8B-1.

FIG. 8B-2 depicts the temporal relationship of tailored deep UV (266 nm) output pulse waveform 96 and pulsed green (532 nm) laser output waveform 92, and FIG. 8B-3 depicts the temporal relationship of deep UV (266 nm) output pulse waveform 96 and tailored green (532 nm) output pulse waveform 94. FIG. 8B-3 shows that the height of a peak amplitude 96p measured from a relatively flat intermediate portion 96i of waveform 96 is significantly greater than the height of a peak amplitude 94p measured from a relatively flat intermediate portion 94i of waveform 94. The significant difference between peak amplitude 96p and peak amplitude 94p stems from the nonlinear harmonic conversion process performed by harmonic conversion module 58, in which P$_3$(t) is proportional to P$_2^2$(t). Precompensation for the nonlinear effect of harmonic conversion on peak amplitude 96p of tailored output pulse waveform 96 entails judicious timing of sequencing of the drive output signals of driver circuitry 74 applied to electrodes 72 of EOM 30. The sequence of drive signals produces the multiple states of output transmission of EOM 30 to form tailored green output pulse waveform 94 of a shape that precompensates for the nonlinear effects to produce tailored deep UV output pulse waveform 96 of a desired shape.

FIG. 8C shows, as a second alternative embodiment, a laser system 84c in which the pulsed laser sources 14d are diode-pumped, Q-switched Nd:YVO$_4$ lasers operating at 1064 nm, the output (denoted schematically as $\lambda_1$, $P_1(t)$) of which is then applied to extracavity harmonic conversion module 58 and subsequently converted to harmonic non-tailored pulse shape output (denoted schematically as $\lambda_2$, $P_2(t)$) at a harmonic wavelength of 355 nm. The harmonic non-tailored pulse shape output is then coupled into FMS EOM 30 to produce harmonic tailored pulse shape output (denoted schematically as $\lambda_2$, $P_3(t)$) at a harmonic wavelength of 355 nm.

Figures 3, 8B:
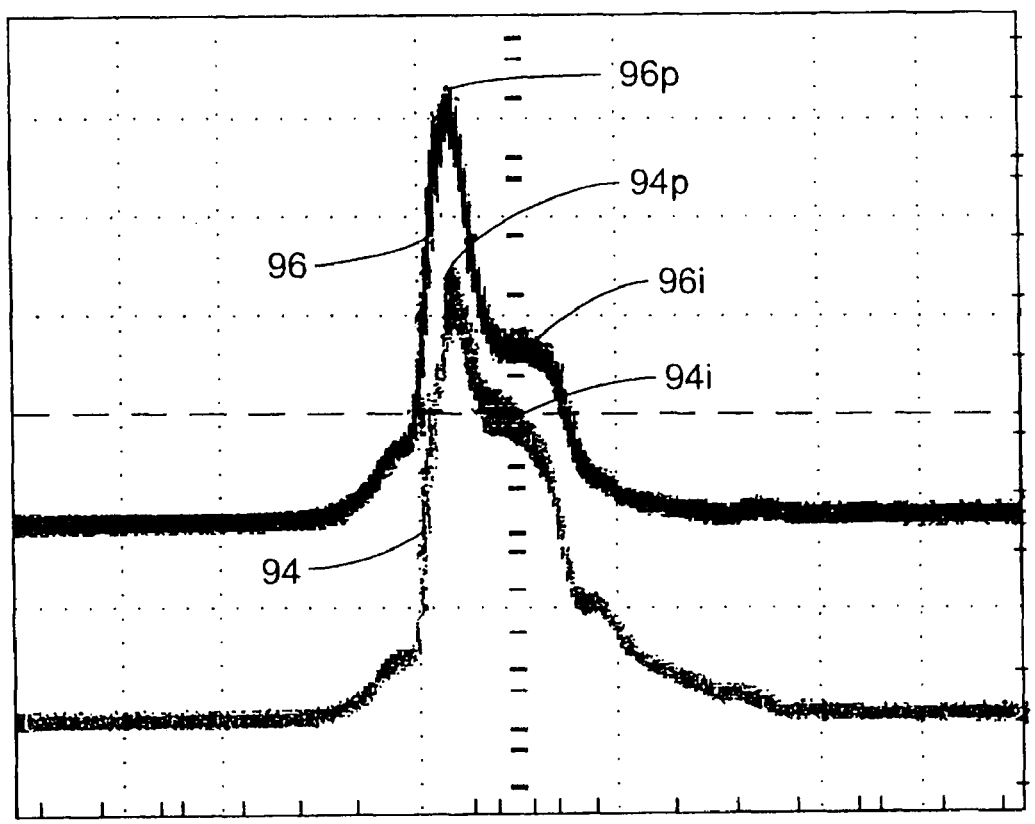
Figure 8D:
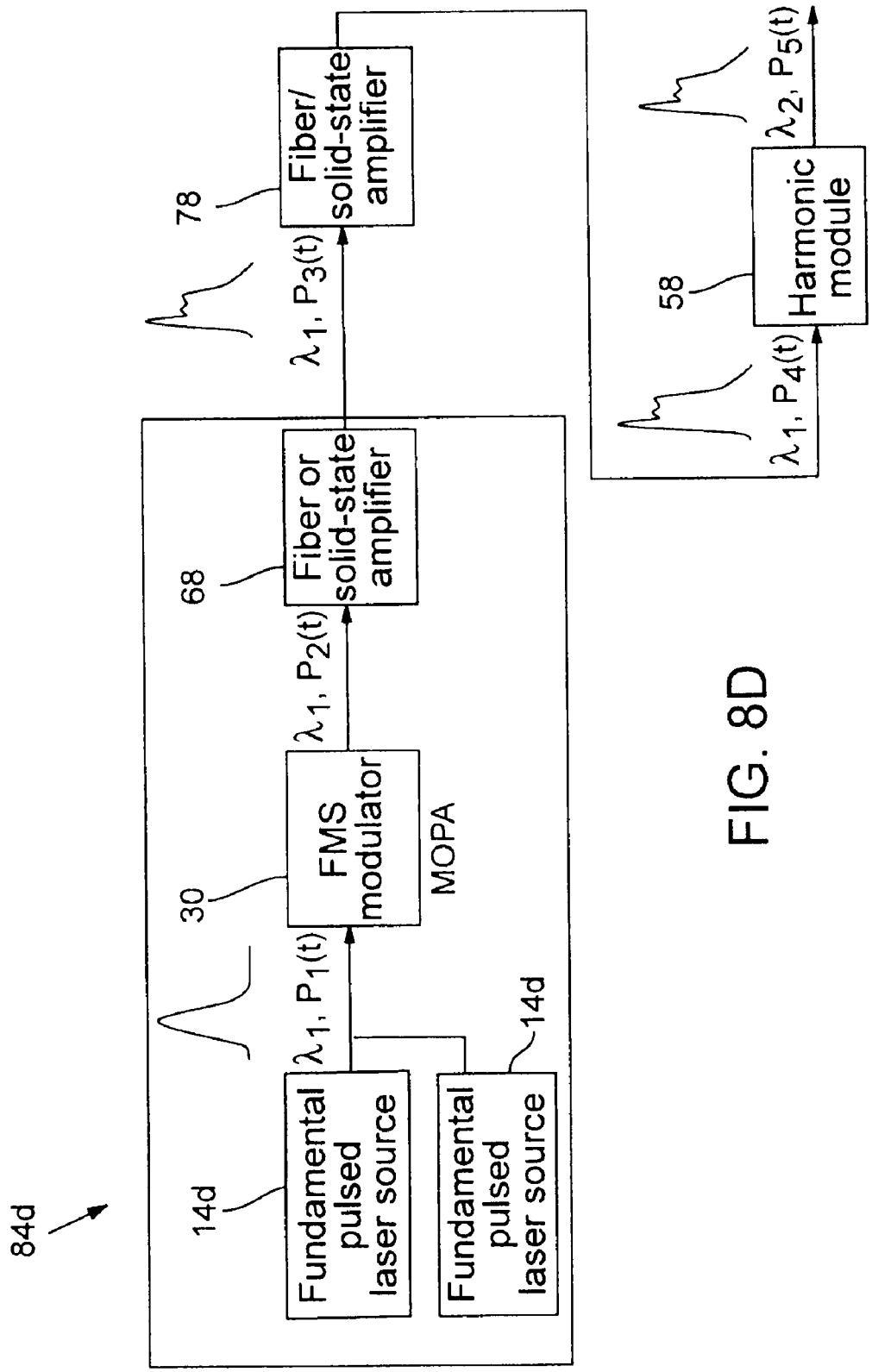
FIG. 8D is a simplified block diagram of a laser system employing a MOPA implemented with an electro-optical modulator to produce a fundamental tailored pulse output for subsequent amplification and harmonic conversion to form an amplified tailored pulse output.

FIG. 8D shows, as a third alternative embodiment, a laser system 84d in which output (denoted schematically as $\lambda_1$, $P_1(t)$) of fundamental pulsed laser sources 14d, which are a diode-pumped, Q-switched Nd:YVO$_4$ lasers operating at 1064 nm is coupled into FMS EOM 30 to produce first fundamental tailored pulse shape output (denoted schematically as $\lambda_1$, $P_2(t)$). First fundamental tailored pulse shape output is then amplified in a diode-pumped fiber or solid state amplifier 68 to produce amplified fundamental tailored pulse shape output (denoted schematically as $P_3(t)$). A preferred embodiment of diode-pumped solid state amplifier 68 is a diode-pumped Nd:YVO$_4$ amplifier. Alternatively, diode-pumped power amplifier 68 may be replaced by a diode-pumped large mode area fiber power amplifier or a diode-pumped photonic crystal fiber power amplifier. Tailored pulse shaped output $\lambda_1$, $P_3(t)$ may subsequently be amplified in a fiber or diode-pumped solid state power amplifier 78 to produce second, amplified tailored pulse shaped output (denoted $\lambda_1$, $P_4(t)$), which is then applied to extracavity harmonic conversion module 58 and subsequently converted to harmonic tailored pulse shape output (denoted schematically as $\lambda_2$, $P_5(t)$) at a harmonic wavelength of 355 nm.

FIG. 9A shows a simplified block diagram of a preferred embodiment of laser system 86a employing FMS EOM 30 and pulsed laser sources 14e that include a master oscillator fiber power amplifier (MOFPA) with programmable pulse width. The programmable pulse width MOFPA produces an output of typically trapezoidal pulse shape. Laser system 86a may also preferably employ a fiber-based interferometer 30a as the optical modulator 30a.

The MOFPA includes a pulsed seed source 88 and a fiber power amplifier 68. Seed source 88 is a pulsed laser source, such as a Q-switched solid-state laser, or a pulsed semiconductor laser. The laser output from seed source laser (denoted schematically as $\lambda_1$, $P_1(t)$) is delivered to fiber power amplifier 68, which produces MOFPA output (denoted schematically as $\lambda_1$, $P_2(t)$). The MOFPA output is preferably of narrow spectral bandwidth (<1.0 nm) and is well-polarized (>100:1) with excellent spatial mode quality (M$^2$<1.2). Fiber power amplifier 68 is preferably a diode-pumped, rare-earth doped fiber amplifier, and the gain fiber in the diode-pumped rare-earth doped fiber amplifier is preferably a multi-clad large mode area fiber. In another preferred embodiment, the gain fiber is a large mode area photonic crystal fiber, which may be a rod-like large mode area photonic crystal fiber.

The MOFPA output is coupled into FMS EOM 30, which is programmed to modify the input pulse shape to a first tailored pulse shape output (denoted schematically as $\lambda_1$, $P_3(t)$) that is suitable for subsequent conversion to harmonic output. The output of FMS EOM 30 is applied to and frequency converted in an extracavity harmonic module 58 to harmonic tailored pulse shape output (denoted schematically as $\lambda_2$, $P_4(t)$) at a harmonic wavelength of 355 nm. The pulse repetition frequency of the harmonic tailored pulse shape MOFPA output from each pulsed laser 14e is preferably greater than about 50 KHz, and more preferably greater than about 150 KHz.

FIG. 9B shows, as an alternative embodiment, a laser system 86b in which pulsed laser source 14e may be a MOFPA, as described above operating at 1064 nm, the output (denoted schematically as $\lambda_1$, $P_1(t)$) of which is applied to extracavity harmonic module 58 and converted to harmonic non-tailored pulse shape output (denoted schematically as $\lambda_2$, $P_2(t)$) at a harmonic wavelength of 355 nm. Harmonic non-tailored pulse shape output is coupled into FMS EOM 30 to produce harmonic tailored pulse shape output (denoted schematically as $\lambda_2$, $P_3(t)$) at a harmonic wavelength of 355 nm. Laser system 86b may also preferably employ a fiber-based interferometer 30a as the optical modulator 30a.

Figure 10:
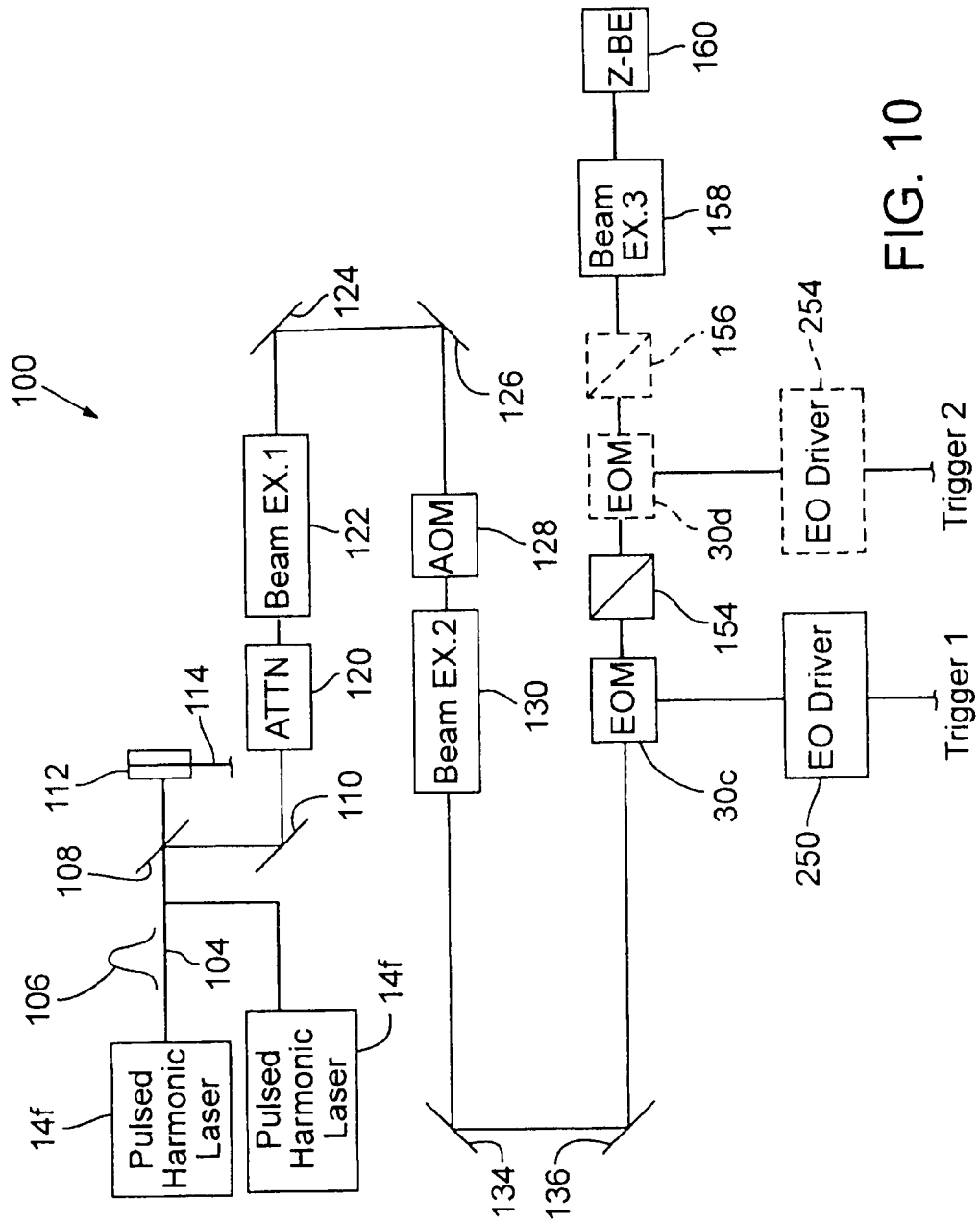
FIG. 10 is a detailed block diagram showing the optical components of a laser system that is implemented with pulsed harmonic laser sources and either one or two FMS electro-optical modulators to produce a desired shaped laser pulse output.

FIG. 10 is a detailed block diagram showing the optical components of a laser system 100 that is implemented with pulsed harmonic laser sources 14f and either one or two FMS EOMs 30c or 30d to produce a desired shaped laser pulse output, as also suggested in FIG. 2. With reference to FIG. 10, laser system 100 includes pulsed harmonic laser sources 14f of preferably an intra-cavity UV DPSS laser type that emits a 355 nm pulsed laser output beam 104. One of laser pulses 106 of output beam 104 is shown at the output of laser source 14f. A suitable laser source 14f is a Tristar™ 2000 UV laser, which is manufactured by the Spectra-Physics division of Newport Corporation, Irvine, Calif., and emits about 1 W of 355 nm power at a 100 KHz repetition rate and an 18 ns pulse width. Laser beam 104 is incident on a highly reflective mirror 108, which directs almost all of the incident laser beam energy to a second highly reflective mirror 110 and provides a leakage amount of the incident laser beam energy to an optical detector 112 that produces a detector output signal 114. A suitable optical detector 112 is a Hamamatsu S3279 photodiode, manufactured by Hamamatsu Photonics KK, Hamamatsu City, Japan. Detector output signal 114 is delivered to each of three embodiments of electro-optical modulator drive circuitry 74, as further described below.

Laser beam 104 reflected by mirror 110 propagates through a manually adjustable attenuator 120 and a first beam expander 122, reflects off of highly reflective beam steering mirrors 124 and 126, and strikes the input of an acousto-optic modulator (AOM) 128 functioning as an electrically controlled attenuator. Laser beam 104 exiting AOM 128 propagates through a second beam expander 130.

In a first implementation of laser system 100, laser beam 104 propagates from second beam expander 130 and, after reflection from reflectors 134 and 136, is incident on optically series-connected electro-optical modulators 30c and 30d, the outputs of which are optically associated with respective polarizers 154 and 156. A suitable electro-optical modulator 30c or 30d is the LightGate 4 BBO Pockels cell described above. The EOMs 30c and 30d receive drive control output signals from electro-optical modulator drive circuitry 210 (FIG. 11) to produce tailored pulse output that propagates through a beam expander 158 and then through a zoom beam expander 160 to provide a programmable laser beam spot for delivery to the system optical components.

In second and third implementations of laser system 100, the EOM 30d and its associated polarizer 156 are absent and laser beam 104 propagates through the EOM 30c and its associated polarizer 154 to zoom beam expander 160. Electro-optical modulator 30c receives a drive control output signal from electro-optical modulator drive circuitry 310 (FIG. 9) for the second implementation and from electro-optical modulator drive circuitry 410 (FIG. 11) for the third implementation. The following descriptions of the three embodiments of electro-optical modulator drive circuitry 210, 310, and 410 enabling the three implementations of laser system 100 present in detail the synthesis of tailored laser pulse temporal profiles.

Figure 11:
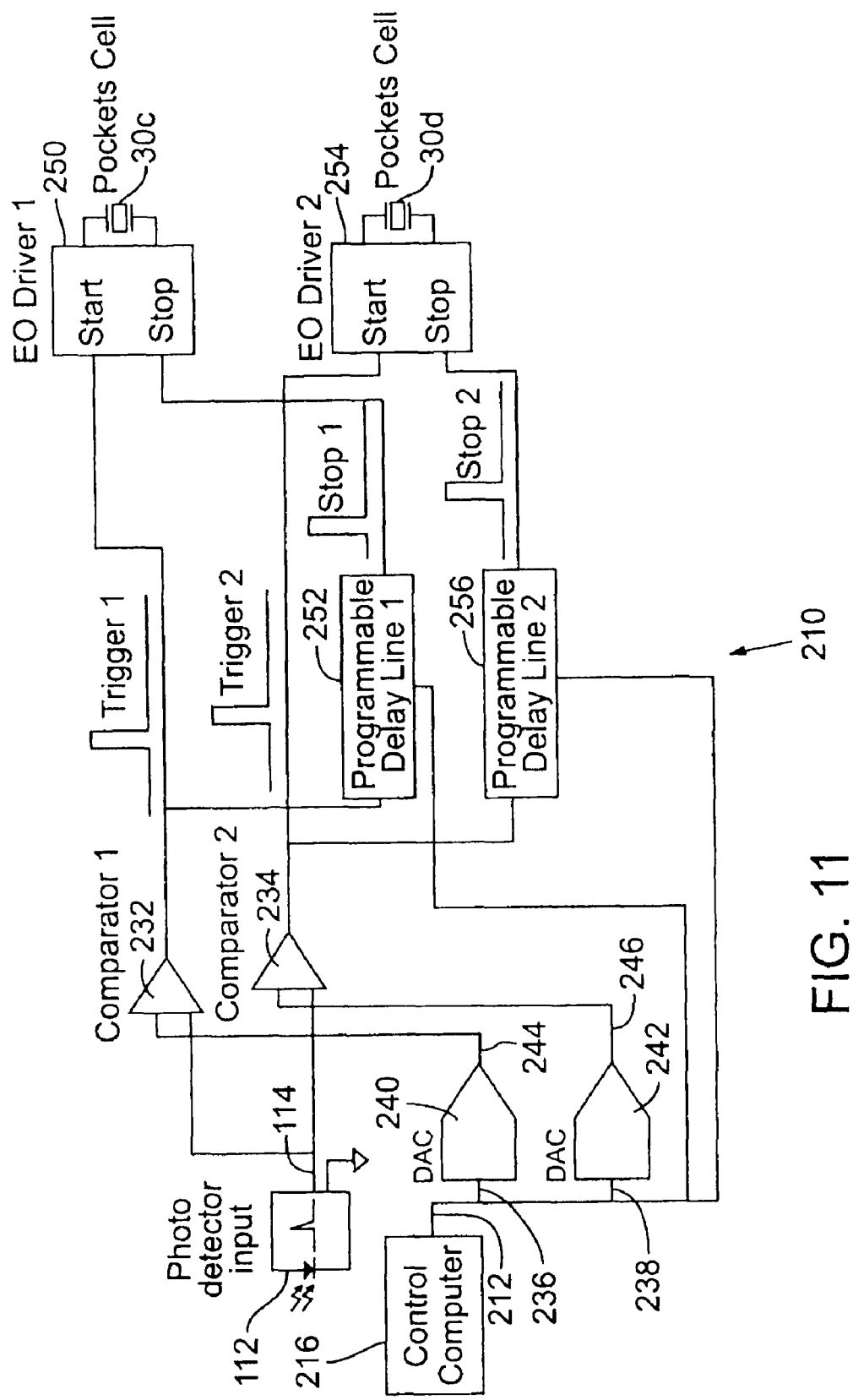
FIG. 11 shows, as a first embodiment, electro-optical modulator drive circuitry that provides drive control output signals to two electro-optical modulators, which in response produce multiple states of output transmission and thereby tailored pulse output.

FIG. 11 shows, as a first embodiment, electro-optical modulator drive circuitry 210 that provides drive control output signals to electro-optical modulators 30c and 30d, which in response produce multiple states of output transmission and thereby tailored pulse output exhibiting a tailored pulse temporal profile. Drive circuitry 210 receives as inputs detector output signal 114 of optical detector 112 and control command output 212 from a control computer 216. Control command output 212 includes trigger thresholds set by control computer 216 for comparison to the changing value of detector output signal 114. Comparison of trigger thresholds to detector output signal 114 produced in response to occurrence of the pulsed laser emission underlies the operation of drive circuit 210. Detector output signal 114 synchronizes the production of multiple states of output transmission to the occurrence of the pulsed laser emission and the control command output contributing to sequencing of the production of multiple states of output transmission of the pulsed laser emission. Such synchronization suppresses introduction of contributions of jitter resulting from effects of the indeterminate energy build-up of laser pulse energy and signal jitter of the laser pulse firing signal in the production of multiple states of output transmission forming the tailored pulse output.

Figure 12:
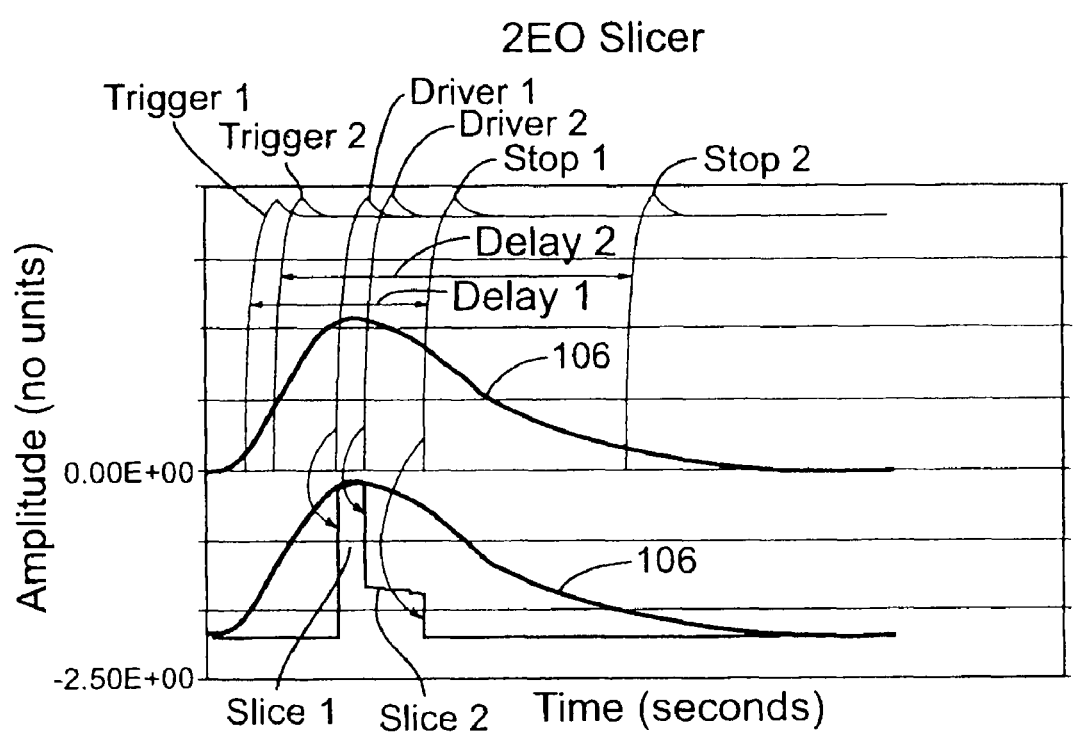
FIG. 12 shows the timing sequence of the signal waveforms produced and the consequent states of output transmission of the electro-optical modulators driven by the drive circuitry of FIG. 11.

The following description of the components and operation of drive circuit 210 is presented with reference to FIG. 11 and FIG. 12, the latter of which showing the timing sequence of the signal waveforms produced and the consequent states of output transmission of EOMs 30c and 30d. Detector output signal 114 is applied to the signal input of each of a first voltage comparator 232 and a second voltage comparator 234. Control command output 212 includes a lower trigger threshold signal 236 and a higher trigger threshold signal 238, which are applied to the respective inputs of digital-to-analog converters (DACs) 240 and 242. A lower threshold voltage output 244 of DAC 240 is applied to the voltage threshold input of first comparator 232, and a higher threshold voltage output 246 of DAC 242 is applied to the voltage threshold input of second comparator 234.

FIGS. 11 and 12 show a Trigger1 signal and a Trigger2 signal that appear at, respectively, the output of comparator 232 and the output of comparator 234. FIG. 11 shows, for purposes of clarity, juxtaposed depictions of laser pulse 106 and the threshold voltages of DAC outputs 244 and 246. The Trigger1 output of comparator 232 is applied to a Start input of a first EO driver 250 and a signal input of a programmable delay line 252. A Stop1 output of delay line 252, which represents a time-displaced version of the Trigger1 output, is applied to a Stop input of first EO driver 250. Similarly, the Trigger2 output of comparator 234 is applied to a Start input of a second EO driver 254 and a signal input of a programmable delay line 256. A Stop2 output of delay line 256, which represents a time-displaced version of the Trigger2 output, is applied to a Stop input of second EO driver 254.

FIGS. 11 and 12 show a Stop1 signal and a Stop2 signal that appear at, respectively, the output of delay line 252 and the output of delay line 256. FIG. 8 (upper traces) shows Delay1 as the time delay between the rising edges of the Trigger1 and Stop1 signals and Delay2 as the time delay between the rising edges of the Trigger2 and Stop2 signals. The amounts of Delay1 and Delay2 are established by delay preset values delivered on control command output 212 that is applied to the delay preset inputs of the respective programmable delay lines 252 and 256. At the beginning of Delay1, the rising edge of the Trigger1 signal produces at the output of first EO driver 250 a Drive1 delay signal transition to a voltage to which EOM 30c responds by switching from a lower output transmission state to a higher output transmission state of the pulsed laser emission. FIG. 12 (lower trace) shows the effect on the pulsed laser emission that results from the transition by first EO driver 250 producing the lower to higher output transmission. The arrow between Drive1 (upper trace) and the first rising edge of Slice1 (lower trace) indicates this effect. During Delay1 and at the beginning of Delay2, the rising edge of the Trigger2 signal produces at the output of second EO driver 254 a Driver2 delay signal transition to a voltage to which EOM 30d responds by switching from a higher output transmission state to an intermediate output transmission state of the pulsed laser emission. The intermediate output transmission state is between the higher and lower output transmission states. FIG. 12 (lower trace) shows the effect on the pulsed laser emission that results from the transition by the second EO driver 254 producing the higher to intermediate output transmission. The arrow between Driver2 (upper trace) and the first falling edge of Slice2 (lower trace) indicates this effect.

Delay1 ends upon the rising edge of the Stop1 signal, which is the result of the delay produced by delay line 252. The end of Delay1 produces a Drive1 delay signal transition to a voltage to which electro-optic modulator 30c responds by switching from the higher output transmission state to the lower output transmission state. FIG. 12 (lower trace) shows the effect of the transition by first EO driver 250 from higher to lower output transmission on the pulsed laser emission. The arrow between Stop1 (upper trace) and the second falling edge of Slice2 (lower trace) indicates this effect.

Finally, Delay2 ends upon the rising edge of the Stop2 signal, which is the result of the delay produced by delay line 256. The end of Delay2 produces a Driver2 delay signal transition to a voltage to which EOM 30d responds by switching from the intermediate output transmission state to the higher output transmission state. The timing of the return of EOM 30d to the higher output transmission state is not critical, so long as the transition takes place after the rising edge of the Stop1 signal and before the next laser pulse emission reaches EOM 30c. In practice, the transition happens after the laser pulse emission is completed insofar as the lower output transmission state of EOM 30c is likely to be greater than zero.

Figure 13:
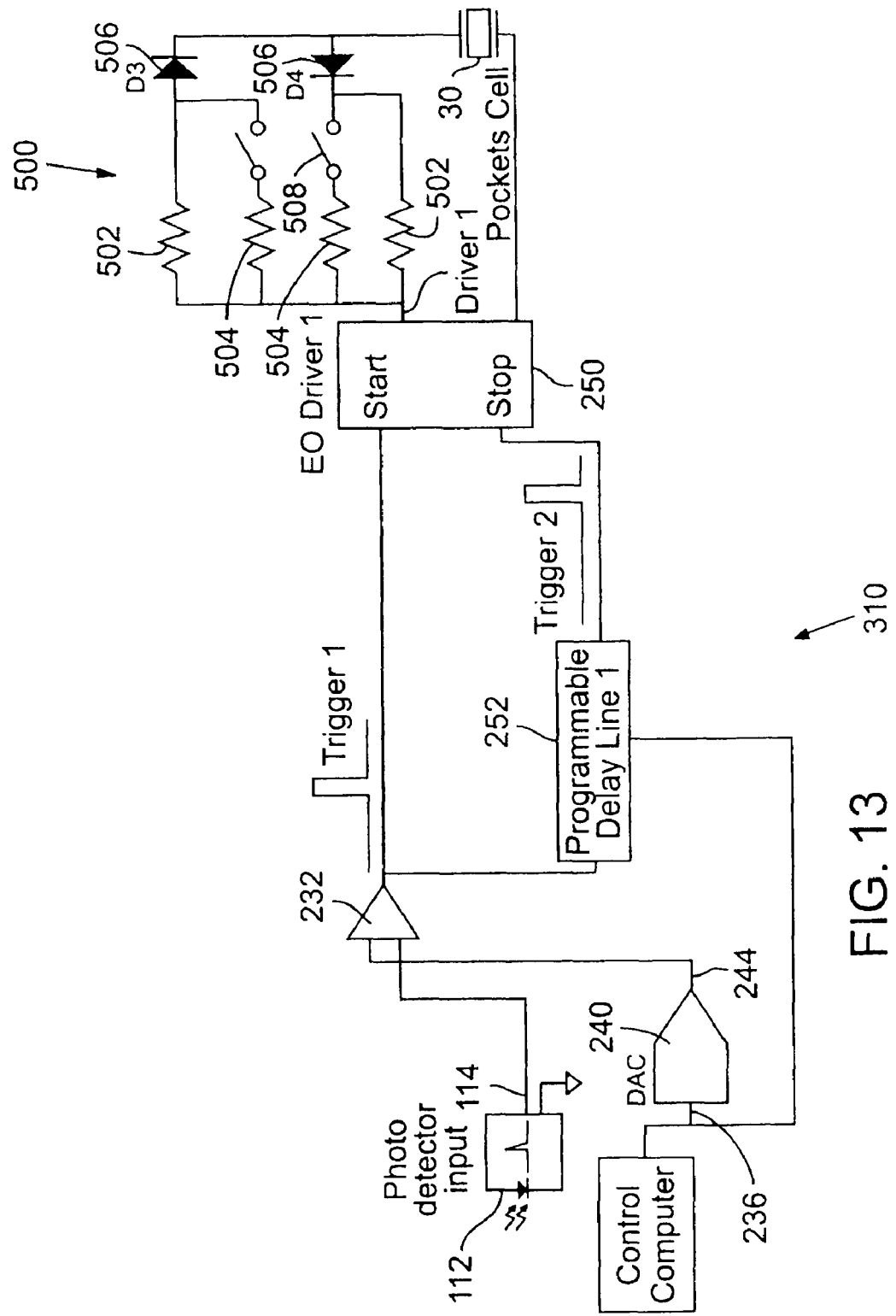
FIG. 13 shows, as a second embodiment, electro-optical modulator drive circuitry that provides a drive control output signal to one of the electro-optical modulators of the system of FIG. 10, which in response produces multiple states of output transmission and thereby tailored pulse output.
Figure 15:
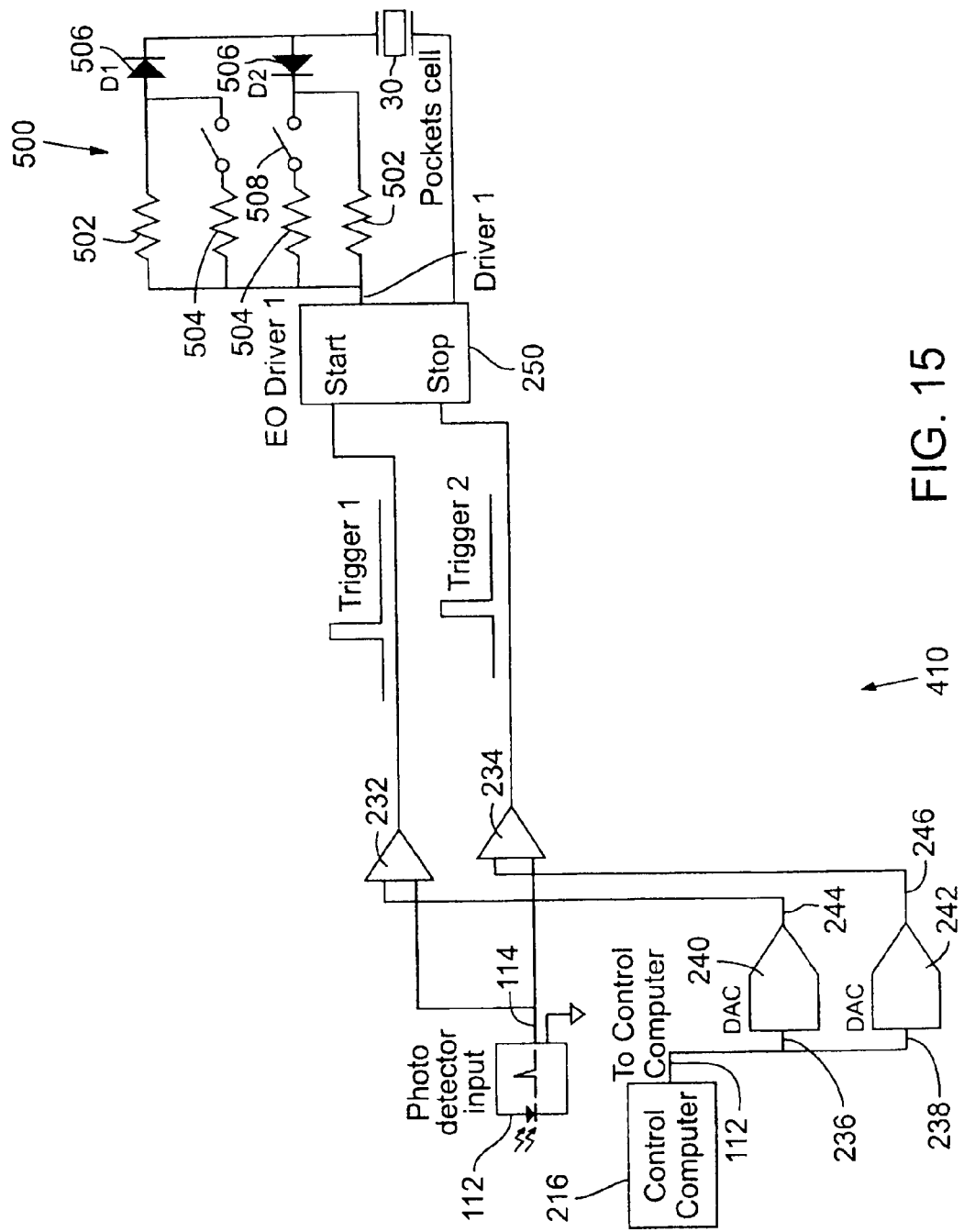
FIG. 15 shows, as a third embodiment, electro-optical modulator drive circuitry that provides a drive control output signal to one of the electro-optical modulators of the system of FIG. 10, which in response produces multiple states of output transmission and thereby tailored pulse output.

FIGS. 13 and 15 show, as second and third embodiments, respective electro-optical modulator drive circuitry 310 and 410 that each provide a drive control output signal to an EOM 30, which in response produces multiple states of output transmission and thereby tailored pulse output exhibiting a tailored pulse temporal profile. (FIG. 10 shows in laser system 100 electro-optical modulator 30d, polarizer 156, and EO driver 254 in dashed lines to indicate omission of them in connection with the embodiments of FIGS. 13 and 15.)

Figure 14:
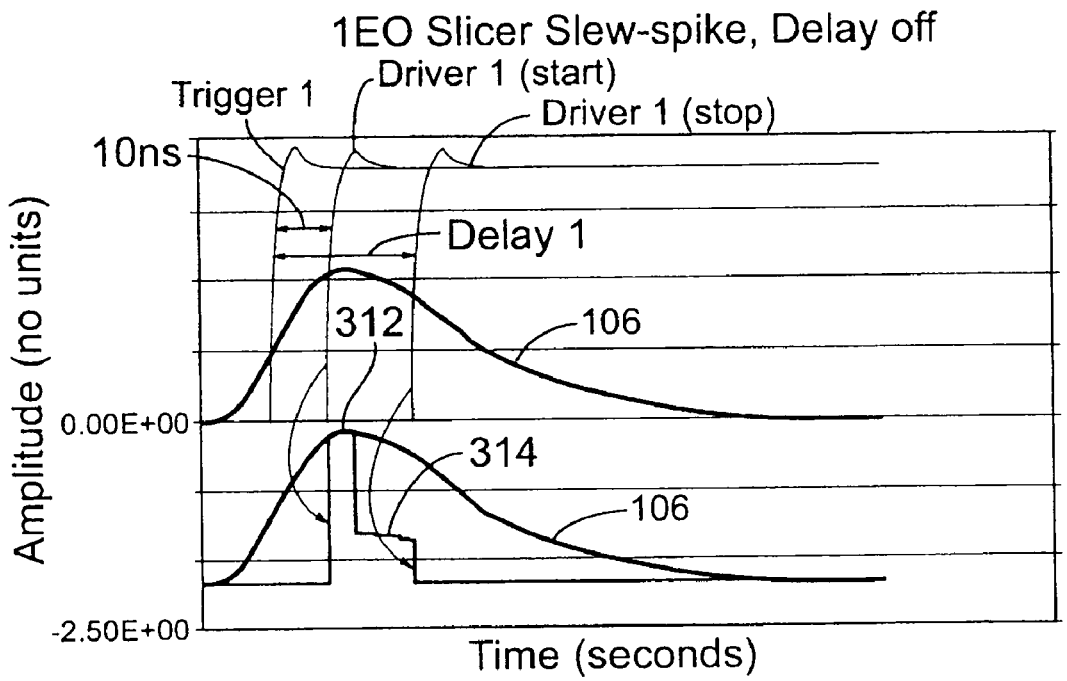
FIG. 14 shows the timing sequence of the signal waveforms produced and the consequent states of output transmission of the electro-optical modulator driven by the drive circuitry of FIG. 13.

The following description of the components and operation of drive circuitry 310 is presented with reference to FIG. 13 and FIG. 14, the latter of which showing the timing sequence of the signal waveforms produced and the consequent states of output transmission of the EOM 30. Drive circuitry 310 receives as inputs detector output signal 114 of optical detector 112 and control command output 212 from control computer 216. Detector output signal 114 is applied to the signal input of voltage comparator 232. Control command output 212 includes trigger threshold signal 236, which is applied to the input of digital-to-analog converter (DAC) 240, and a delay preset value, which is applied to the delay preset input of programmable delay line 252.

FIGS. 13 and 14 show a Trigger1 signal that appears at the output of comparator 232. FIG. 13 shows laser pulse 106 and the threshold voltage of DAC output 244. The Trigger1 output of comparator 232 is applied to the Start input of EO driver 250 and the signal input of programmable delay line 252. The Trigger2 output of delay line 252, which represents a time-displaced version of the Trigger1 output, is applied to the Stop input of EO driver 250.

FIG. 14 (upper traces) shows Delay1 as the time delay between the rising edges of the Trigger1 and Trigger2 signals. About 10 ns after the rising edge of the Trigger1 signal, EO driver 250 produces at its output a Drive1 (Start) signal transition to a voltage to which the EOM 30 responds by switching from a minimum output transmission state to a maximum output transmission state, and thereafter to an intermediate output transmission state, of the pulsed laser emission. (The 10 ns delay from Trigger1 to Drive1 (Start) represents a circuit delay inherent in EO driver 250.) The intermediate output transmission state is between the maximum and minimum output transmission states. This switching sequence of output transmission states is achieved by a voltage level appearing at the output of EO driver 250 that drives the EOM 30 to a voltage overdrive condition. To reach the voltage overdrive condition, the EOM 30 slews through the maximum output transmission state, to form a high amplitude portion 312 of the pulsed laser emission, and then to the intermediate output transmission state, to dwell there for a time to form the flat amplitude portion 314 of the pulsed laser emission. FIG. 14 (lower trace) shows the effect on the pulsed laser emission that results from the transition by EO driver 250 producing minimum to maximum output transmission, and thereafter to intermediate output transmission.

Delay1 ends upon the rising edge of the Stop1 signal, which is the result of the delay produced by delay line 252 and the 10 ns circuit delay of EO driver 250. At the end of Delay1, EO driver 250 produces at its output a Drive1 (Stop) signal transition to a voltage to which the EOM 30 responds by switching from the intermediate output transmission state to the minimum output transmission state. FIG. 14 (lower trace) shows the effect on the pulsed laser emission that results from the transition by EO driver 250 producing intermediate to minimum output transmission. The switching from the intermediate to the maximum output transmission states is achieved by slewing the EOM 30 back through the maximum output transmission state to the minimum output transmission state to form the second falling edge of the pulsed laser emission. The maximum output transmission state forms at the end of the pulsed laser emission a second peak amplitude portion (not shown in FIG. 14), which should be negligible because of the low energy level of the laser pulse 106 at that time.

Figure 16:
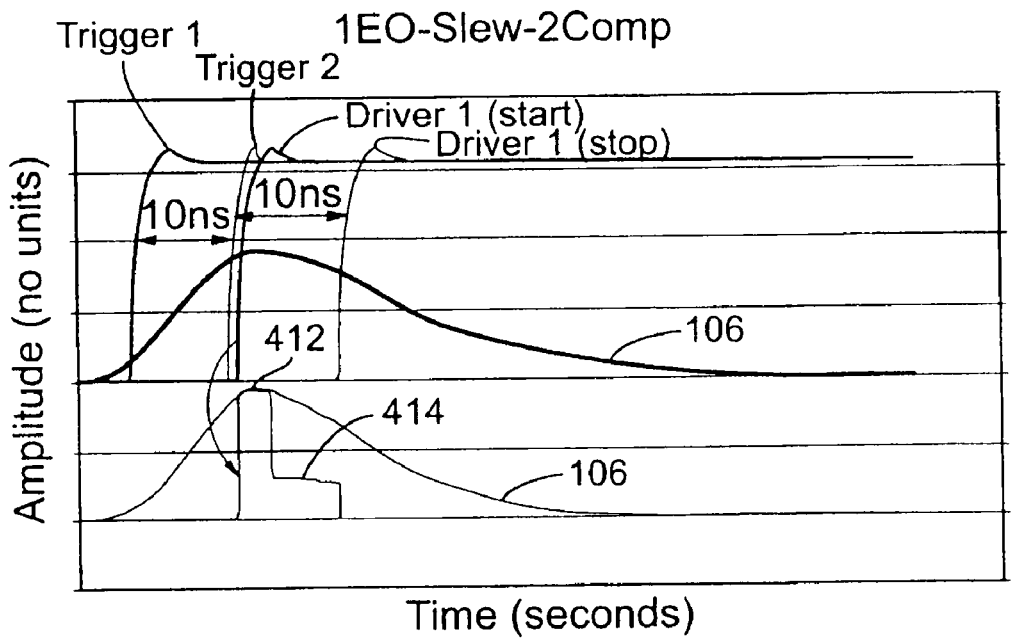
FIG. 16 shows the timing sequence of the signal waveforms produced and the consequent states of output transmission of the electro-optical modulator driven by the drive circuitry of FIG. 15.

The following description of the components and operation of drive circuitry 410 is presented with reference to FIG. 15 and FIG. 16, the latter of which showing the timing sequence of the signal waveforms produced and the consequent states of output transmission of the EOM 30. Drive circuitry 410 receives as inputs detector output signal 114 of optical detector 112 and control command output 212 from control computer 216. Control command output 212 includes trigger thresholds set by control computer 216 for comparison to the changing value of detector output signal 114. Detector output signal 114 is applied to the signal input of each of first voltage comparator 232 and second voltage comparator 234. Control command output 212 includes a positive-going voltage trigger threshold signal 236 and a negative-going voltage trigger threshold signal 238, which are applied to the respective inputs of digital-to-analog converters (DACs) 240 and 242. A positive-going trigger threshold voltage output 244 of DAC 240 is applied to the voltage threshold input of first comparator 232, and a negative-going trigger threshold voltage output 246 of DAC 242 is applied to the voltage threshold input of second comparator 234.

FIGS. 15 and 16 show Trigger1 and Trigger2 signals that appear at the outputs of comparators 232 and 234, respectively. FIG. 16 shows laser pulse 106 and the threshold voltage of DAC output 244. The Trigger1 output of comparator 232 is applied to the Start input of EO driver 250, and the Trigger2 output of comparator 234 is applied to the Stop input of EO driver 250.

FIG. 16 (upper traces) shows that at about 10 ns after the rising edge of the Trigger1 signal, EO driver 250 produces at its output a Drive1 (Start) signal transition to a voltage to which the EOM 30 responds by switching from a minimum output transmission state to a maximum output transmission state, and thereafter to an intermediate output transmission state, of the pulsed laser emission. The intermediate output transmission state is between the maximum and minimum output transmission states. This switching sequence of output transmission states is achieved by a voltage level appearing at the output of EO driver 250 that drives the EOM 30 to a voltage overdrive condition. To reach the voltage overdrive condition, the EOM 30 slews through the maximum output transmission state, to form a high amplitude portion 412 of the pulsed laser emission, and then to the intermediate output transmission state, to dwell there for a time to form the flat amplitude portion 414 of the pulsed laser emission. FIG. 16 (lower trace) shows the effect on the pulsed emission that results from the transition by EO driver 250 producing minimum to maximum output transmission, and thereafter to intermediate output transmission.

The Trigger2 signal is produced as a result of the elapsed rise time of laser pulse 106 between its pulse amplitude levels corresponding to trigger threshold signals 236 and 238. About 10 ns after the rising edge of the Trigger2 signal, EO driver 250 produces at its output a Driver1 (Stop) signal transition to a voltage to which the EOM 30 responds by switching from the intermediate output transmission state to the minimum output transmission state. FIG. 16 (lower trace) shows the effect on the pulsed laser emission that results from the transition by EO driver 250 producing intermediate to minimum output transmission. The switching from the intermediate to the maximum output transmission states is achieved by slewing the EOM 30 back through the maximum output transmission state to the minimum output transmission state to form the second falling edge of the pulsed laser emission. The maximum output transmission state forms at the end of the pulsed laser emission a second peak amplitude portion (not shown in FIG. 12), which should be negligible because of the low pulse amplitude energy level of the laser pulse 106 at that time.

FIGS. 13 and 15 show a resistor-diode array 500 positioned between the EOM 30 and the output of driver 250 of each of the respective electro-optical modulator drive circuitry 310 and 410 to provide to the EOM 30 the drive control output signal with a controllable shape. Because the crystal of the EOM 30 appears electrically as a capacitor, the inclusion of a resistor or an array of switchable resistors can be used to control the voltage slopes of the tailored pulse temporal profile. Resistor-diode array 500 includes two parallel-connected subcircuits, each including parallel-connected resistors 502 and 504 in series connection with a steering diode 506. Resistor 504 in series connection with a switch 508 can be switched in or out of its subcircuit to change the effective resistance value, and steering diodes 506 of the subcircuits are installed in opposite directions to facilitate asymmetric slopes for the rising and falling edges of the tailored pulse temporal profile.

Figure 17:
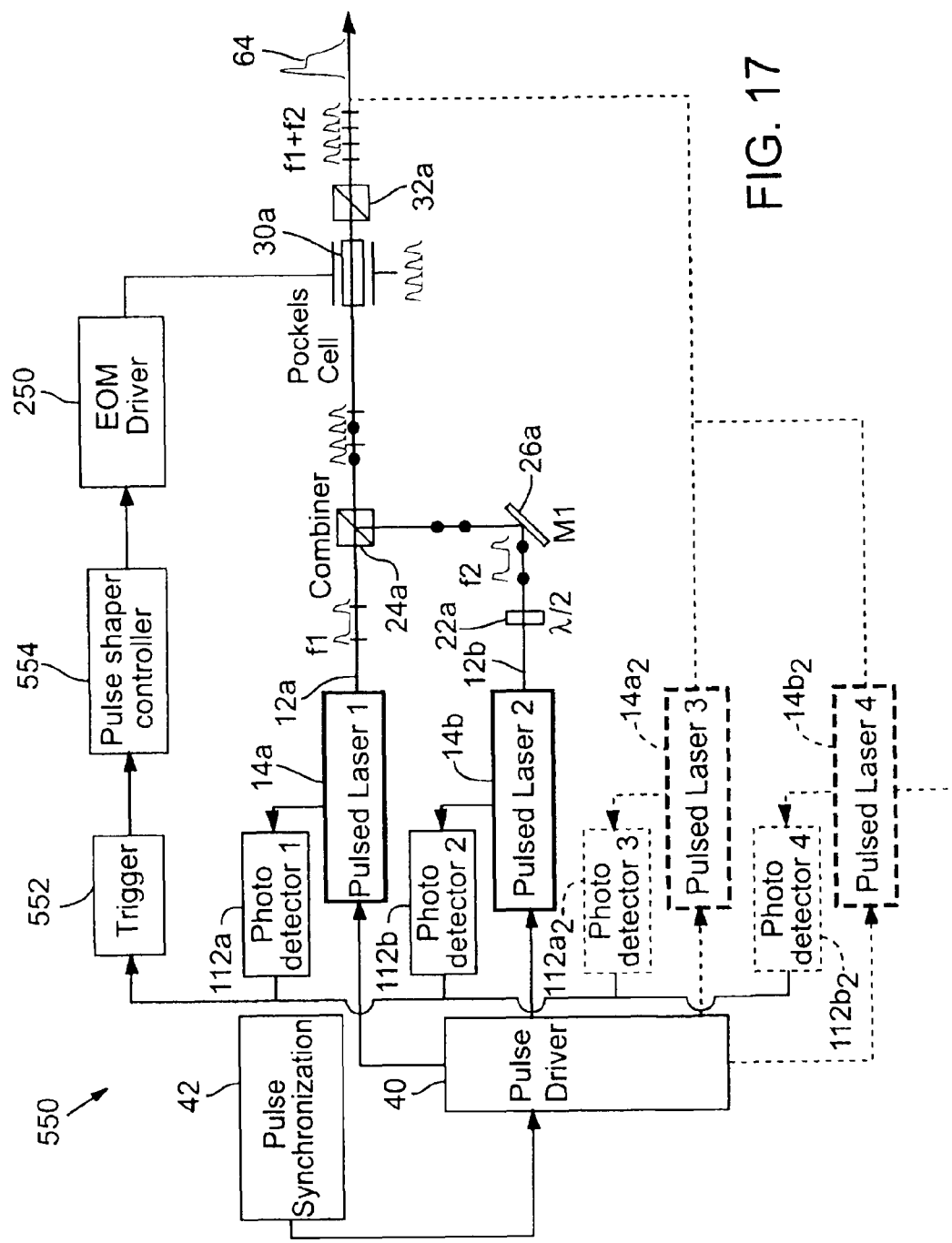
FIG. 17 is a block diagram of an exemplary laser system employing photodetectors and a pulse shape controller to facilitate multifunctional capabilities of an electro-optic device including beam combination and pulse shaping.

FIG. 17 shows a laser system 550 that is configured to suppress jitter associated with pulsed laser emission build-up time and thereby contribute to synchronization of the pulse shape, pulse picking, and beam combining functions of an EOM 30*a*. Implementation of jitter suppression enables high throughput laser processing with composite laser beam 18 composed of closely spaced laser pulses. For convenience, FIG. 17 uses some reference numerals that are the same as or similar to those identifying similar corresponding components in other figures. Also for convenience, the details of the scaling features, particularly the beam path components, have been omitted for simplicity.

With reference to FIG. 17, laser system 550 employs optical detectors 112*a*, 112*b*, 112*a$_2$*, and 112*b$_2$* to provide signals to a common trigger circuit 552 to synchronize the switching function of EOM 30*a* to the initiation of pulse emissions of the respective pulsed lasers 14*a*, 14*b*, 14*a$_2$*, and 14*b$_2$*. Trigger circuit 552 may provide timing information to a pulse shape controller 554 or directly to EOM driver 250. EOM 30*a* responds in the same manner as that described with reference to the generic EOM 30 of FIGS. 11-16. More specifically, laser controller for pulse synchronization 42 provides to pulse driver 40 control command output that specifies a sequence of laser pulse emissions from pulsed lasers 14*a*, 14*b*, 14*a$_2$*, and 14*b$_2$* and a corresponding sequence of switching states assumed by EOM 30*a*. Pulse driver 40 receives the control command output and delivers separate series of output pulses to pulsed lasers 14*a*, 14*b*, 14*a$_2$*, and 14*b$_2$* to which they response by emitting laser output in the specified sequence.

To achieve jitter suppression for laser system 550, pulsed lasers 14*a*, 14*b*, 14*a$_2$*, and 14*b$_2$* provide, in a manner similar to that described above with reference to laser system 100 of FIG. 10, a leakage amount of incident laser beam energy to respective optical detectors 112*a*, 112*b*, 112*a$_2$*, and 112*b$_2$* that produce detector output signals for delivery to trigger circuit 552. The detector output signals produced in response to the occurrences of the pulsed laser emissions synchronize the switching operation of EOM 30*a* such that a selected laser pulse emission from one of the pulsed lasers 14*a*, 14*b*, 14*a$_2$*, and 14*b$_2$* reaches EOM 30*a* at a known time at which EOM 30*a* assumes a retardation state that corresponds to the selected laser pulse emission.

The use of optical detectors 112*a*, 112*b*, 112*a$_2$*, and 112*b$_2$* and trigger circuit 552 can reduce or eliminate most of the time jitter issues and permit closer spacing of the pulses from different pulsed laser sources 14. Without jitter, the closer spacing between pulses from scaled sets can allow even greater scaling, as well as greater pulse shaping control. For example, EOM 30*a* can achieve sub-nanosecond, even picosecond rise and fall times, which can be use to generate tailored pulses for link processing and generate short pulses for via-drilling at very high repetition rates and very high peak power. The doubled or further scaled pulse repetition rate can increase the throughput of the system.

In addition to facilitating pulse shaping control, trigger circuit 552 can also be used to facilitate the timing with respect to pulse picking by applying beam propagation-blocking beam polarization changes. Similarly, trigger circuit 552 can also be used to facilitate the timing with respect to beam combining by applying beam polarization changes to the orthogonally polarized beam. Finally, trigger circuit 552 can be used to perform any combination of two, or all three, of the pulse shaping, pulse picking, and beam combining operational capabilities of an EOM 30*a*.

Skilled persons will appreciate that the subject matter or embodiment(s) of every sentence may be cumulative to the subject matter or embodiment(s) of all of the other sentences or embodiments, except where the subject matter of given sentences or embodiments is mutually exclusive.

Many of the above-described embodiments facilitate creation of composite beams exhibiting previously impracticable characteristics. For example, embodiments disclosed herein facilitate creation of a stable UV composite polarized beam having a composite repetition rate of greater than 200 KHz and a composite average power greater than 1 kilowatt.

It will be obvious to those having skill in the art that many changes may be made to the details of the above-described embodiments without departing from the underlying principles of the invention. For example, the nonlinear conversion forming a frequency-converted laser output can be performed also to provide a longer wavelength laser output. The scope of the present invention should, therefore, be determined only by the following claims.

The invention claimed is:

1. A method of synthesizing a high power, high repetition rate polarized laser beam, comprising:
   generating a first polarized laser beam of multiple first polarized laser pulses having a first average power at a first repetition rate, the first polarized laser pulses characterized by a first polarization state;
   generating a second polarized laser beam of multiple second polarized laser pulses having a second average power and a second repetition rate, the second polarized laser pulses characterized by a second polarization state;
   generating of the first and second polarized laser beams producing the first polarized laser pulses in temporal nonoverlapping relationship with the second polarized laser pulses;
   introducing optical retardation so that the first and second polarization states of the respective first and second polarized laser pulses are orthogonally related;
   combining in an optical beam combiner the first and second polarized laser beams in the orthogonally related polarization states, the optical beam combiner characterized by low loss of the first and second average powers when combining the respective first and second polarized laser beams in the orthogonally related first and second polarization states and producing a combined beam of the first and second polarized laser pulses propagating along a combined beam path; and
   providing along the combined beam path an optical modulator that is operable to selectively change the orthogonal relationship of the polarization states of the first and second polarized laser pulses of the combined beam to produce a composite polarized beam of the first and second laser pulses, the optical modulator responsive to different values of a control signal to selectively impart to the combined beam different amounts of optical retardation so that the first and second polarization states of the respective first and second polarized laser pulses of the composite polarized beam are uniformly related;
   whereby the composite polarized beam has an average composite power that is greater than the first and second average powers at a composite repetition rate that is greater than the first and second repetition rates.

2. The method of claim 1, in which the optical modulator includes an EOM.

3. The method of claim 2, in which the optical modulator includes a Pockels cell.

4. The method of claim 1, in which the first and second polarized laser beams are generated by respective first and second seed lasers.

5. The method of claim 4, further comprising:
positioning an optical isolator along the combined beam path downstream of the optical modulator; and
positioning a fiber amplifier along the combined beam path downstream of the optical isolator.

6. The method of claim 1, further comprising:
directing propagation of the composite polarized beam to an optical polarizer positioned along the combined beam path downstream of the optical modulator; and
delivering to the optical modulator the control signal having values that control the optical modulator to impart to selected ones of the first and second polarized laser pulses optical retardation that causes each of the selected polarized laser pulses incident on the optical polarizer to assume a polarization state that results in blockage of transmission by the optical polarizer.

7. The method of claim 6, in which the control signal has values that control the optical modulator to impart to a number of the first and second polarized laser pulses optical retardation in amounts that cause corresponding tailoring of shapes of the number of first and second polarized laser pulses.

8. The method of claim 1, in which the control signal has values that control the optical modulator to impart to a number of the first and second polarized laser pulses optical retardation in amounts that cause corresponding tailoring of shapes of the number of first and second polarized laser pulses.

9. The method of claim 1, in which the first and second polarized laser beams are characterized by emission wavelengths, and further comprising:
positioning a harmonic generator along the combined beam path and downstream of the optical modulator to generate from the composite polarized beam a converted composite polarized beam of harmonic wavelengths of the emission wavelengths of the first and second polarized laser beams.

10. The method of claim 1, in which the first and second polarized laser beams are characterized by different emission wavelengths.

11. The method of claim 1, in which the composite polarized beam comprises a stream of alternating first and second polarized laser pulses.

12. The method of claim 1, in which the composite polarized beam comprises a stream of two or more consecutive first polarized laser pulses positioned between two second polarized laser pulses.

13. The method of claim 1, further comprising:
using optical detectors to produce detector output signals in response to occurrences of the first and second polarized laser pulses generated by the respective first and second pulsed lasers; and
providing drive circuitry to produce, in response to the detector output signals, the different values of the control signal to suppress a contribution of jitter resulting from effects of indeterminate energy build-up time of the first and second polarized laser pulses on the different amounts of optical retardation selectively imparted to the combined beam.

14. A laser system synthesizing a high power, high repetition rate polarized laser beam, comprising:
a first pulsed laser generating, in response to a first driver signal produced by pulse driver circuitry, a first beam of multiple first polarized laser pulses propagating in a first polarization state along a first beam path and having a first average power at a first repetition rate;
a second pulsed laser generating, in response to a second driver signal produced by the pulse driver circuitry, a second beam of multiple second polarized laser pulses propagating in a second polarization state along a first beam path and having a second average power at a second repetition rate;
an optical retarder device positioned in one of the first and second beam paths to introduce optical retardation so that the first and second polarization states of the respective first and second polarized laser pulses are orthogonally related;
an optical beam combiner intersecting the first and second beam paths and combining the first and second polarized laser pulses in the orthogonally related respective first and second polarization states for propagation along a combined beam path, the optical beam combiner characterized by a loss of less than one-half of the first and second average powers when combining the first and second polarized laser pulses;
an optical modulator positioned along the combined beam path downstream of the optical beam combiner, the optical modulator responsive to different values of a modulator control signal to selectively impart to the combined beam corresponding different amounts of optical retardation that change the orthogonal relationship of the polarization states of the first and second polarized laser pulses of the combined beam to produce a composite polarized beam of the first and second polarized laser pulses of which the respective polarization states are uniformly related; and
a laser controller coordinating the first and second pulse driver signals and the modulator driver signal so that the first and second polarized laser pulses are in temporal nonoverlapping relationship and so that the selective imparting of different amounts of optical retardation takes place when corresponding ones of the first and second polarized laser pulses in the combined beam are incident on the optical modulator, whereby the composite polarized beam has an average composite power that is greater than the first and second average powers at a composite repetition rate that is greater than the first and second repetition rates.

15. The system of claim 14, further comprising:
optical detectors producing detector output signals in response to occurrences of the first and second polarized laser pulses generated by the respective first and second pulsed lasers; and
drive circuitry producing, in response to the detector output signals, the different values of the modulator control signal to suppress a contribution of jitter resulting from effects of indeterminate energy build-up time of the first and second polarized laser pulses on the different amounts of optical retardation selectively imparted to the combined beam.

16. The system of claim 14, in which the first and second polarized laser beams are generated by respective first and second seed lasers.

17. The system of claim 16, further comprising:
an optical isolator positioned along the combined beam path downstream of the optical modulator; and
a fiber amplifier positioned along the combined beam path downstream of the optical isolator.

18. The system of claim 14, further comprising an optical polarizer positioned along the combined beam path downstream of the optical modulator to receive the composite polarized beam, the optical modulator receiving the control signal having values that control the optical modulator to impart, to selected ones of the first and second polarized laser pulses, optical retardation that causes each of the selected polarized laser pulses incident on the optical polarizer to assume a polarization state that results in blockage of transmission by the optical polarizer.

19. The system of claim 18, in which the control signal has values that control the optical modulator to impart to a number of the first and second polarized laser pulses optical retardation in amounts that cause corresponding tailoring of shapes of the number of the first and second polarized laser pulses.

20. The system of claim 14, in which the first and second polarized laser beams are characterized by different emission wavelengths.

* * * * *